United States Patent
Hashiya et al.

(10) Patent No.: US 9,647,240 B2
(45) Date of Patent: *May 9, 2017

(54) LIGHT EMITTING APPARATUS

(71) Applicant: PANASONIC INTELLECTUAL PROPERTY MANAGEMENT CO., LTD., Osaka (JP)

(72) Inventors: Akira Hashiya, Osaka (JP); Yasuhisa Inada, Osaka (JP); Kazuyuki Yamae, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/891,811

(22) PCT Filed: Jan. 17, 2014

(86) PCT No.: PCT/JP2014/000221
§ 371 (c)(1),
(2) Date: Nov. 17, 2015

(87) PCT Pub. No.: WO2014/188631
PCT Pub. Date: Nov. 27, 2014

(65) Prior Publication Data
US 2016/0141554 A1    May 19, 2016

(30) Foreign Application Priority Data
May 21, 2013  (JP) .................................. 2013-107044

(51) Int. Cl.
*H01L 51/52*    (2006.01)
*H01L 51/50*    (2006.01)
(Continued)

(52) U.S. Cl.
CPC ........ *H01L 51/5275* (2013.01); *G02B 3/0068* (2013.01); *G02B 5/0242* (2013.01);
(Continued)

(58) Field of Classification Search
CPC ..... H01L 51/00; H01L 51/52; H01L 51/5275; H01L 33/00; H01L 33/12; H01L 33/40;
(Continued)

(56) References Cited

U.S. PATENT DOCUMENTS

2002/0180348 A1    12/2002  Oda et al.
2004/0189185 A1    9/2004   Yotsuya
(Continued)

FOREIGN PATENT DOCUMENTS

EP    2555587 A1    2/2013
JP    2991183       12/1999
(Continued)

OTHER PUBLICATIONS

Search Report issued by International Patent Application in Patent Application No. PCT/JP2014/000221, dated Apr. 22, 2014.
(Continued)

*Primary Examiner* — Chuong A Luu
(74) *Attorney, Agent, or Firm* — Greenblum & Bernstein, P.L.C.

(57) ABSTRACT

An illuminator includes a light-emitting element and a light extraction sheet which transmits light occurring from the light-emitting element. The light-emitting element includes a first electrode having a light transmitting property, a second electrode, and an emission layer between the first and second electrodes. The light extraction sheet includes a light-transmitting substrate having a first face and a second face, a first light extraction structure on the first face side of the light-transmitting substrate, and a second light extraction structure on the second face side of the light-transmitting
(Continued)

substrate. The first light extraction structure includes a low-refractive index layer and a high-refractive index layer having a higher refractive index than the low-refractive index layer. The second light extraction structure is arranged so that light which is transmitted through the light-transmitting substrate and arrives at an incident angle of 60 to 80 degrees has an average transmittance of 20% or more.

19 Claims, 25 Drawing Sheets

(51) Int. Cl.
    *G02B 3/00*     (2006.01)
    *G02B 5/02*     (2006.01)

(52) U.S. Cl.
    CPC .... *G02B 5/0278* (2013.01); *H01L 2251/5315* (2013.01); *H01L 2251/5361* (2013.01)

(58) Field of Classification Search
    CPC ......... H01L 33/50; H01L 33/36; H01L 33/44; H01L 33/48; H01L 33/46; H01L 51/50
    USPC .................. 257/98, 80, 82, 88, 95, 431, 432
    See application file for complete search history.

(56) References Cited

U.S. PATENT DOCUMENTS

| | | |
|---|---|---|
| 2006/0192483 A1 | 8/2006 | Nakanishi et al. |
| 2008/0197764 A1 | 8/2008 | Bechtel et al. |
| 2010/0046236 A1 | 2/2010 | Nishiwaki |
| 2010/0110551 A1 | 5/2010 | Lamansky et al. |
| 2011/0080737 A1 | 4/2011 | Nishiwaki et al. |
| 2012/0248970 A1 | 10/2012 | Okuyama et al. |
| 2012/0286258 A1 | 11/2012 | Naraoka et al. |
| 2012/0292652 A1 | 11/2012 | Yamae et al. |
| 2013/0015486 A1 | 1/2013 | Sekine et al. |
| 2015/0364644 A1 | 12/2015 | Yoshida et al. |
| 2016/0049562 A1* | 2/2016 | Inada .................. H01L 51/5275 257/98 |

FOREIGN PATENT DOCUMENTS

| | | |
|---|---|---|
| JP | 2003-100444 | 4/2003 |
| JP | 2004-241130 | 8/2004 |
| JP | 2006-190573 | 7/2006 |
| JP | 2008-541368 | 11/2008 |
| JP | 2009-272059 | 11/2009 |
| JP | 2010-212204 | 9/2010 |
| JP | 2013-057736 | 3/2013 |
| JP | 2012-227122 | 11/2015 |
| WO | 2009/063636 | 5/2009 |
| WO | 2010/051229 A2 | 5/2010 |
| WO | 2012/108384 A1 | 8/2012 |

OTHER PUBLICATIONS

Search Report issued in European Patent Office (EPO) Patent Application No. 14783361.0, dated Apr. 7, 2016.

* cited by examiner

EMISSION POINT (a) RANDOM 1  w = 0.6 μm w (b) RANDOM 2  w = 1.2 μm w

ASPECT RATIO = l/L (a) AVERAGE PERIOD 3W    (b) AVERAGE PERIOD 3.3W    (c) AVERAGE PERIOD 3.4W

LIGHT EMITTING APPARATUS

TECHNICAL FIELD

The present application relates to an illuminator.

BACKGROUND ART

As organic electro-luminescence devices (hereinafter referred to as "organic EL devices") of generic structures, those are known in which a hole injection layer, a hole transport layer, an organic emission layer, an electron transport layer, an electron injection layer, and a cathode are stacked in this order on a transparent electrode (anode) that is formed on the surface of a transparent substrate. By applying a voltage between the anode and the cathode, light occurs from the organic emission layer. The generated light is transmitted through the transparent electrode and the transparent substrate to be extracted to the exterior.

Organic EL devices are characterized by being self-light-emitting type devices, having emission characteristics with a relatively high efficiency, being capable of emission in various color tones, and so on. Therefore, their application to light-emitting elements in display devices (e.g., flat panel displays) and light sources (e.g., backlights or illuminations for liquid crystal display devices) is considered as promising, and some of that has already matured into practical use. In order to apply organic EL devices to such uses, it is desirable to develop organic EL devices that have good characteristics marked by higher efficiency, longer life, and higher luminance.

There are mainly three factors that govern the efficiency of an organic EL device: efficiency of electrical-optical conversion, driving voltage, and light extraction efficiency.

As for efficiency of electrical-optical conversion, those with an external quantum efficiency over 20% have been reported due to the rise of so-called phosphor materials in recent years. As converted into an internal quantum efficiency, this value would be equivalent to substantially 100%. In other words, there have already been experimental instances where the substantial limit value of efficiency of electrical-optical conversion is reached.

As for driving voltage, devices are becoming available which achieve emission with relatively high luminance at a voltage that is about 10% to 20% greater than the voltage corresponding to an energy gap. In other words, in organic EL devices, there is not much room for efficiency improvement based on reduced driving voltage.

Thus, efficiency improvements in organic EL devices based on improving on the two factors of efficiency of electrical-optical conversion and driving voltage are not highly expectable.

On the other hand, the light extraction efficiency of an organic EL device, which is generally on the order of 20% to 30% although subject to some fluctuation depending on the emission pattern and internal layer structure, leaves room for improvement. The reason for such low light extraction efficiency is that the material(s) composing the sites of light emission and their neighborhood has characteristics such as a high refractive index and light absorption. This causes a problem in that total reflection may occur at interfaces between different refractive indices and light may be absorbed by the material(s), thus hindering effective light propagation to the exterior where emission is to be observed. Consequently, in an organic EL device, non-available light accounts for 70% to 80% of the total emission amount. Thus, there is a very large expectation of improvements in the efficiency of an organic EL device that are based on light extraction efficiency improvements.

Against this background, many attempts at improving the light extraction efficiency have been made up to the present. For example, Patent Document 1 discloses an organic EL device having a diffraction grating for suppressing total reflection at an interface. Patent Document 2 discloses an organic EL device in which a microlens array is provided on the surface of a transparent substrate. Patent Document 3 discloses an organic EL device having an optical sheet with an optical layer that includes beads dispersed in a binder.

CITATION LIST

Patent Literature

[Patent Document 1] the specification of Japanese Patent No. 2991183

[Patent Document 2] Japanese Laid-Open Patent Publication No. 2004-241130

[Patent Document 3] Japanese Laid-Open Patent Publication No. 2003-100444

SUMMARY OF INVENTION

Technical Problem

However, the aforementioned conventional techniques only provide limited effects of improving the efficiency of light extraction, and further efficiency improvements are desired. In addition to the aforementioned organic EL devices, this problem similarly applies to other kinds of illuminators in which inorganic EL devices or usual light-emitting diodes or the like are used.

One non-limiting, and exemplary embodiment of the present application provides an illuminator with an enhanced efficiency of light extraction.

Solution To Problem

In order to solve the above problems, a light extraction sheet according to an implementation of the present disclosure comprises: a light-transmitting substrate having a first face and a second face; a first light extraction structure on the first face side of the light-transmitting substrate, the first light extraction structure including a low-refractive index layer and a high-refractive index layer having a higher refractive index than does the low-refractive index layer, the low-refractive index layer being between the light-transmitting substrate and the high-refractive index layer, and an interface between the high-refractive index layer and the low-refractive index layer having bump-dent features; and a second light extraction structure on the second face side of the light-transmitting substrate, the second light extraction structure being arranged so that light which is transmitted through the light-transmitting substrate and arrives at an incident angle of 60 degrees to 80 degrees has an average transmittance of 20% or more.

The aforementioned general/specific implementation can be implemented by using a system, a method, or a computer program, or can be realized by using a combination of a system, a method, and a computer program.

Advantageous Effects of Invention

An illuminator according to an implementation of the present disclosure provides an enhanced efficiency of light extraction.

BRIEF DESCRIPTION OF DRAWINGS

FIG. 10 A diagram schematically showing a portion of an external light-extraction layer 16 having a plurality of diffusive particles 16b provided inside a light-transmitting member 16a.

DESCRIPTION OF EMBODIMENTS

Figure 1:
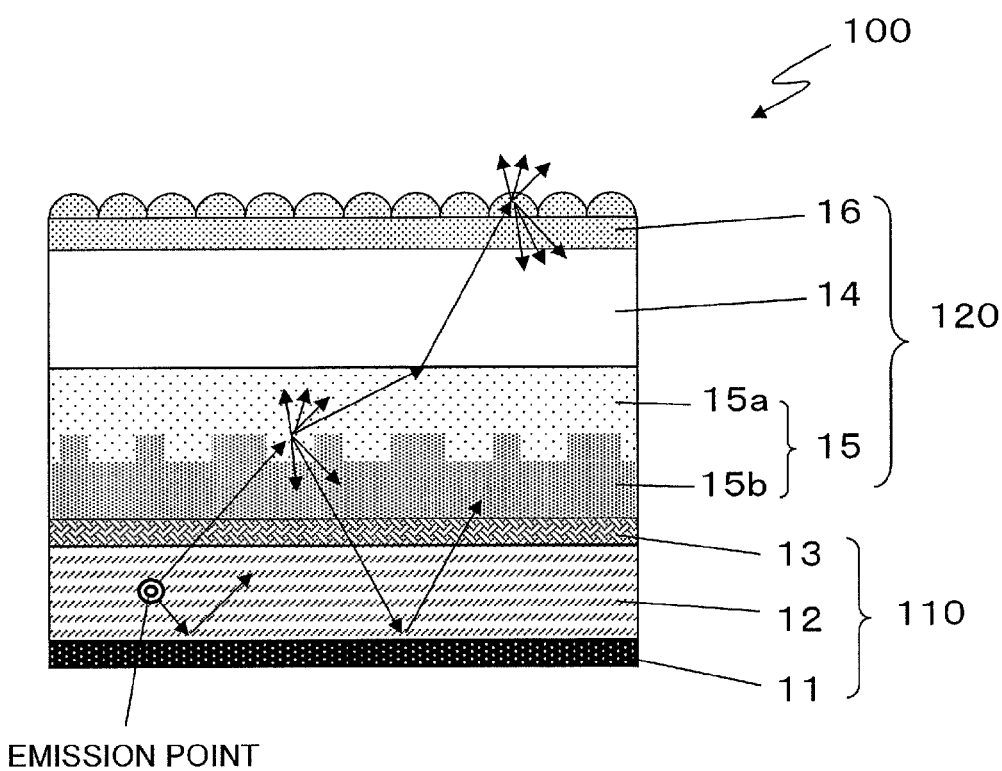
FIG. 1 A cross-sectional view showing an organic EL device according to an illustrative embodiment.

Prior to describing specific embodiments, a finding that served as a basis of the present invention will be described first.

In conventional generic organic EL devices, in which the organic emission layer has a refractive index of 1.7 to 2.0 and the transparent substrate has a refractive index of about 1.5, total reflection occurs at the interface between the organic emission layer and the transparent substrate. The loss of light due to such total reflection may be as large as about 50% or more of the entire radiated light, according to an analysis by the inventors. Furthermore, since the transparent substrate has a refractive index of about 1.5 and air has a refractive index of about 1.0, the loss of light caused by total reflection at the interface between the transparent substrate and air accounts for about 50% of the light reaching the interface of the transparent substrate. Thus, there are very large total reflection losses at these two interfaces.

The inventors have found a novel construction which can reduce the total reflection losses at these two interfaces. Specifically, we have found that the light extraction efficiency can be improved in a construction where: a first light extraction structure to cause light diffraction is provided between an emission layer and a transparent substrate; and a second light extraction structure such as a microlens array is provided on the opposite side of the transparent substrate from the emission layer. Hereinafter, embodiments based on this finding will be described.

In outline, embodiments of the present disclosure are as follows.

An illuminator according to one implementation of the present disclosure comprises: a light-emitting element for emitting light of an average wavelength λ; and a light extraction sheet which transmits light occurring from the light-emitting element. The light-emitting element includes a first electrode having a light transmitting property, a second electrode, and an emission layer between the first and second electrodes. The light extraction sheet includes: a light-transmitting substrate having a first face on the light-emitting element side and a second face on an opposite side from the light-emitting element; a first light extraction structure on the first face side of the light-transmitting substrate, the first light extraction structure including a low-refractive index layer and a high-refractive index layer having a higher refractive index than does the low-refractive index layer, the low-refractive index layer being between the light-transmitting substrate and the high-refractive index layer, and an interface between the high-refractive index layer and the low-refractive index layer having bump-dent features; and a second light extraction structure on the second face side of the light-transmitting substrate, the second light extraction structure being arranged so that light which is transmitted through the light-transmitting substrate and arrives at an incident angle of 60 degrees to 80 degrees has an average transmittance of 20% or more.

In one embodiment, the second light extraction structure comprises a diffusing layer including a light-transmitting member having a refractive index na and a plurality of diffusive particles inside the light-transmitting member, the plurality of diffusive particles having a refractive index nb.

In one embodiment, given a rate p which the volume of the plurality of diffusive particles accounts for in the volume of the diffusing layer, a thickness d of the diffusing layer, and an average radius r of the plurality of diffusive particles, a diffusing power D which is defined as:

[math. 1]

$$D = \frac{|n_a - n_b|}{n_a} \cdot p \cdot \frac{d}{r}$$

is greater than 0 and not more than 5.

In one embodiment, the diffusing power D is 3.5 or less.
In one embodiment, the diffusing power D is not less than 0.05 and not more than 1.
In one embodiment, the second light extraction structure has geometric features on a surface through which light goes out.

In one embodiment, an array of trapezoidal prisms is formed on the surface of the second light extraction structure through which light goes out.

In one embodiment, the trapezoidal prisms each have a cross-sectional shape which is a trapezoid resulting from cutting off a vertex of a triangle, and an aspect ratio is defined as a ratio l/L of the height l of the trapezoid to the height L of the triangle, such that: a vertex angle of each triangle is not less than 10 degrees and not more than 18 degrees, and the aspect ratio is not less than 0.73 but less than 1; or a vertex angle of each triangle is not less than 45 degrees and not more than 115 degrees, and the aspect ratio is not less than 0.44 but less than 1.

In one embodiment, a microlens array is formed on the surface of the second light extraction structure through which light goes out.

In one embodiment, an aspect ratio defined as a ratio between the height and the radius of the microlens array is greater than 0.5.

In one embodiment, an array of pyramid shapes is formed on the surface of the second light extraction structure through which light goes out.

In one embodiment, the pyramid shapes have a vertex angle of not less than 25 degrees and not more than 115 degrees.

In one embodiment, a portion of the second light extraction structure that has the geometric features has a packing fraction of 36% or more.

In one embodiment, the low-refractive index layer has a thickness of (½)λ or more.

In one embodiment, the bump-dent features comprise a random or periodic two-dimensional array of a plurality of dents and a plurality of bumps.

In one embodiment, the bump-dent features comprise a two-dimensional array of a plurality of dents and a plurality of bumps, and among spatial frequency components of a pattern of the bump-dent features, those components which are smaller than 1/(2w) are suppressed as compared to when the plurality of dents and the plurality of bumps are randomly arrayed, where w is a minimum value of lengths of shorter sides of ellipses which are inscribed in the plurality of dents and the plurality of bumps.

In one embodiment, the bump-dent features are arranged so that no three or more dents or bumps are successively present along one direction.

In one embodiment, the plurality of dents and the plurality of bumps both have an average period of 14.5λ or less.

In one embodiment, a minimum value of lengths of shorter sides of ellipses which are inscribed in the plurality of dents and the plurality of bumps is 0.73λ or more.

In one embodiment, the plurality of dents and the plurality of bumps each have a rectangular or hexagonal cross section.

A light extraction sheet according to one implementation of the present disclosure comprises: a light-transmitting substrate having a first face and a second face; a first light extraction structure on the first face side of the light-transmitting substrate, the first light extraction structure including a low-refractive index layer and a high-refractive index layer having a higher refractive index than does the low-refractive index layer, the low-refractive index layer being between the light-transmitting substrate and the high-refractive index layer, and an interface between the high-refractive index layer and the low-refractive index layer having bump-dent features; and a second light extraction structure on the second face side of the light-transmitting substrate, the second light extraction structure being arranged so that light which is transmitted through the light-transmitting substrate and arrives at an incident angle of 60 degrees to 80 degrees has an average transmittance of 20% or more.

(Embodiment)

Hereinafter, a more specific embodiment will be described. In the present embodiment, an illuminator in which an organic EL device is utilized will be described as an example.

[1. Overall Construction]

FIG. 1 is a cross-sectional view showing a schematic construction of an organic EL device 100 according to the present embodiment. The organic EL device 100 of the present embodiment includes a light-emitting element 110 and a light extraction sheet 120 which transmits light occurring from the light-emitting element 110. The light-emitting element 110 includes a reflection electrode 11 having a light-reflecting property, a transparent electrode 13 having a light transmitting property, and an organic emission layer 12 formed between them. The light extraction sheet 120 includes a transparent substrate 14, an internal light-extraction layer (first light extraction structure) 15 provided on the first face (i.e., the lower side in FIG. 1) of the transparent substrate 14, and an external light-extraction layer (second light extraction structure) 16 provided on the second face (i.e., the upper side in FIG. 1) of the transparent substrate 14. As shown in FIG. 1, the reflection electrode 11, the organic emission layer 12, the transparent electrode 13, the internal light-extraction layer 15, the transparent substrate 14, and the external light-extraction layer 16 are stacked in this order. The internal light-extraction layer 15 includes a low-refractive index layer 15a having a relatively low refractive index and a high-refractive index layer 15b having a relatively high refractive index. The interface between the low-refractive index layer 15a and the high-refractive index layer 15b has bump-dent features so as to diffract incident light.

The reflection electrode 11 is an electrode (cathode) for injecting electrons into the emission layer 12. When a predetermined voltage is applied between the reflection electrode 11 and the transparent electrode 13, electrons are injected from the reflection electrode 11 into the emission layer 12. As the material of the reflection electrode 11, for example, silver (Ag), aluminum (Al), copper (Cu), magnesium (Mg), lithium (Li), sodium (Na), or an alloy containing these as main components, etc., can be used. Moreover, a combination of such metals may be stacked to form the reflection electrode 11; and a transparent electrically-conductive material such as indium tin oxide (ITO) or PEDOT:PSS (a mixture of polythiophene and polystyrene sulfonate) may be stacked in contact with such metals to form the reflection electrode 11.

The transparent electrode 13 is an electrode (anode) for injecting holes into the emission layer 12. The transparent electrode 13 may be composed of a material such as a metal, an alloy, or an electrically-conductive compound having a relatively large work function, a mixture thereof, etc. Examples of the material of the transparent electrode 13 include: inorganic compounds such as ITO, tin oxides, zinc oxides, IZO (registered trademark), and copper iodide;

electrically conductive polymers such as PEDOT and polyaniline; electrically conductive polymers doped with an arbitrary acceptor or the like; electrically-conductive light transmitting-materials such as carbon nanotubes.

After forming the internal light-extraction layer 15 on the transparent substrate 14, the transparent electrode 13 can be formed as a thin film by a sputtering technique, a vapor deposition technique, an application technique, or the like.

The sheet resistance of the transparent electrode 13 is set to e.g. several hundred Ω/□ or less, and in some instances may be set to 100 Ω/□ or less. The film thickness of the transparent electrode 13 is e.g. 500 nm or less, and in some instances may be set in a range of 10 to 200 nm. As the transparent electrode 13 becomes thinner, the light transmittance will improve, but the sheet resistance will increase because sheet resistance increases in inverse proportion to film thickness. When organic EL is to be achieved in a large area, this may lead to high voltage issues, and problems of nonuniform luminance due to nonuniform current density caused by a voltage drop. In order to avoid this trade off, auxiliary wiring (grid) of a metal or the like may be formed on the transparent electrode 13. As the material of the auxiliary wiring, those with good electrically conductive are used. For example, Ag, Cu, Au, Al, Rh, Ru, Ni, Mo, Cr, Pd, or an alloy thereof (MoAlMo, AlMo, AgPdCu, etc.) can be used. At this time, the grid portion may be subjected to an insulation treatment to prevent a current flow, so that the metal grid will not serve as a light-shielding material. In order to prevent diffused light from being absorbed by the grid, a metal with high reflectance may be used for the grid.

Although the present embodiment illustrates that the transparent electrode 13 is an anode and the reflection electrode 11 is a cathode, the polarities of these electrodes may be opposite. Materials similar to those mentioned above can be used for the transparent electrode 13 and the reflection electrode 11 even in the case where the transparent electrode 13 is the cathode and the reflection electrode 11 is the anode.

The emission layer 12 is made of a material which generates light through recombination of electrons and holes that are injected from the transparent electrode 13 and the reflection electrode 11. For example, the emission layer 12 can be made of a low-molecular-weight or high-molecular-weight light-emitting material, or any commonly-known light-emitting material such as metal complexes. Although not shown in FIG. 1, an electron transport layer and a hole transport layer may be provided on both sides of the emission layer 12. The electron transport layer is provided on the reflection electrode 11 (cathode) side, while the hole transport layer is provided on the transparent electrode 13 (anode) side. In the case where the reflection electrode 11 is the anode, the electron transport layer is to be provided on the transparent electrode 13 side, and the hole transport layer is to be provided on the electrode 11 side. The electron transport layer can be selected as appropriate from among compounds having an electron-transporting property. Examples of such compounds include: Alq3 or other metal complexes known as electron-transporting materials; compounds having heterocycles, such as phenanthroline derivatives, pyridine derivatives, tetrazine derivatives, and oxadiazole derivatives; and the like. However, without being limited to these materials, any commonly-known electron-transporting material can be used. The hole transport layer can be selected as appropriate from among compounds having a hole-transporting property. Examples of such compounds include 4,4'-bis[N-(naphthyl)-N-phenyl-amino]biphenyl(α-NPD); N,N'-bis(3-methylbiphenyl)-(1,1'-biphenyl)-4,4'-diamine(TPD); 2-TNATA; 4,4',4"-tris(N-(3-methylbiphenyl)N-phenylamino)triphenylamine (MTDATA); 4,4'-N,N'-dicarbazolebiphenyl(CBP); spiro-NPD; Spiro-TPD; Spiro-TAD; or, triarylamine-type compounds such as TNB, amine compounds containing a carbazole group, amine compounds including fluorene derivatives, and so on. However, without being limited to these materials, any commonly-known hole-transporting material can be used. Thus, in addition to the emission layer 12, other layers such as an electron transport layer and a hole transport layer may be provided between the reflection electrode 11 and the transparent electrode 13. In the following description, the layer(s) between the reflection electrode 11 and the transparent electrode 13 may collectively be referred to as an "organic EL layer".

Without being limited to the above examples, various structures may be adopted as the structure of the organic EL layer. For example, a multilayer structure of a hole transport layer and the emission layer 12, or a multilayer structure of the emission layer 12 and an electron transport layer may be adopted. Moreover, a hole injection layer may be present between the anode and a hole transport layer, or an electron injection layer may be present between the cathode and an electron transport layer. Without being limited to a single layer structure, the emission layer 12 may have a multilayer structure. For example, when the desired emission color is white, the emission layer 12 may be doped with three dopant dyes of red, green, and blue. Moreover, a multilayer structure of a blue hole-transporting emission layer, a green electron-transporting emission layer, and a red electron-transporting emission layer may be adopted; or a multilayer structure of a blue electron-transporting emission layer, a green electron-transporting emission layer, and a red electron-transporting emission layer may be adopted. Furthermore, a structure in which a plurality of emission units are stacked via an intermediate layer(s) having a light transmitting property and electrically conductivity (i.e., a multiunit structure in electrical series connection) may be adopted, where each emission unit is defined as layers composing a device that emits light when interposed between an anode and a cathode and a voltage is applied thereto.

The transparent substrate 14 is a member for supporting the internal light-extraction layer 15, the transparent electrode 13, the emission layer 12, and the reflection electrode 11. As the material of the transparent substrate 14, for example, a transparent material such as glass or resin can be used. The transparent substrate 14 has a refractive index on the order of 1.45 to 1.65, for example; however, a high-refractive index substrate having a refractive index of 1.65 or more, or a low-refractive index substrate having a refractive index less than 1.45 may also be used.

The internal light-extraction layer 15 is a light-transmitting layer which is provided between the transparent substrate 14 and the transparent electrode 13. The internal light-extraction layer 15 includes the low-refractive index layer 15a formed on the transparent substrate 14 side and the high-refractive index layer 15b formed on the transparent electrode 13 side. Their interface constitutes a bump-dent structure.

Figure 2A:
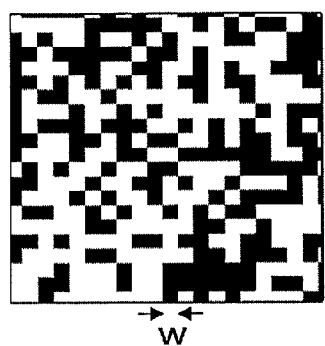
FIG. 2A A plan view showing an exemplary bump-dent structure.
Figure 2B:
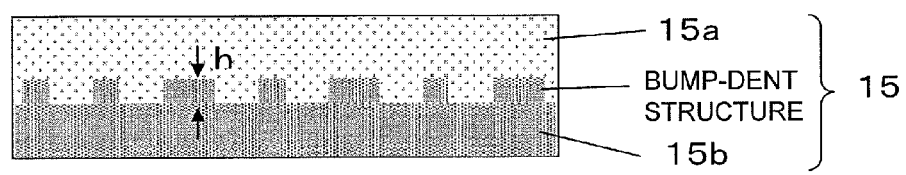
FIG. 2B A cross-sectional view showing an exemplary bump-dent structure.

FIG. 2A is a plan view schematically showing an exemplary bump-dent structure in the present embodiment. FIG. 2B is a cross-sectional view schematically showing a part of the bump-dent structure. In FIG. 2A, black regions and white regions respectively represent portions (bumps) where the high-refractive index layer 15b is formed relatively thick and portions (dents) where the high-refractive index layer 15b is formed relatively thin. This bump-dent structure is a random two-dimensional array of two kinds of square-shaped unit structures (with a level difference h) each having a side length (width) w. In the following description, each unit structure may be referred to as a "block". By providing such a bump-dent structure, it becomes possible to diffract incident light. As will be described later, instead of adopting a completely random pattern for the bump-dent structure, a structure may be adopted whose randomness is reduced so that no unit structures of the same kind successively appear a predetermined number of times or more along one direction. Moreover, a periodic pattern may be adopted as the pattern of the bump-dent structure. The light extraction efficiencies when these respective constructions are adopted will be described later.

A portion of the light occurring from the emission layer 12 is incident on the internal light-extraction layer 15 via the transparent electrode 13. At this time, any light that strikes at an incident angle exceeding the critical angle, which would normally have undergone total reflection, receives a diffractive action by the internal light-extraction layer 15 so that a portion thereof is extracted through the transparent substrate 14. The light which has not been extracted by the internal light-extraction layer 15 is reflected so as to travel at a different angle toward the emission layer 12, but is thereafter reflected by the reflection electrode 11, thus again being incident on the internal light-extraction layer 15. On the other hand, a portion of the light occurring from the emission layer 12 is reflected by the electrode 11, and then is transmitted through the transparent electrode 13 so as to be incident on the internal light-extraction layer 15. Thus, providing the internal light-extraction layer 15 allows light to be extracted toward the exterior through repetitive multiple reflection.

The external light-extraction layer 16 is provided on the surface of the transparent substrate 14 (i.e., the face opposite to the face on which the internal light-extraction layer 15 is provided). The external light-extraction layer 16 may be composed of a microlens array, for example. As will be described later, the external light-extraction layer 16 is arranged so that light which is transmitted through the transparent substrate 14 and arrives at an incident angle of 60 degrees to 80 degrees has an average transmittance of 20% or more. So long as such characteristics are possessed, the external light-extraction layer 16 may have different surface structures from a microlens array. The specific construction of the external light-extraction layer 16 will be described later. Providing the external light-extraction layer 16 allows a portion of the light which is transmitted through the transparent substrate 14 and arrives at an incident angle exceeding the critical angle to be extracted into the external layer of air. The unextracted light will again return to the emission layer 12, but will eventually be reflected by the reflection electrode 11, thus being able to be extracted back into the air layer. The air layer has a refractive index of 1.0, for example.

If absorption of light by materials occurs before the light is extracted, it will detract from efficiency; therefore, materials with a low light absorbing property may be used for the reflection electrode 11, the emission layer 12, the transparent electrode 13, and the internal light-extraction layer 15 in the present embodiment.

[2. Details and Analysis of Constituent Elements]

Hereinafter, details of the respective constituent elements of the organic EL device 100 and the analytic results that led to the construction of the present embodiment will be described.

[2-1. Studying Construction of Internal Light-Extraction Layer 15]

[2-1-1. Construction of Bump-Dent Structure]

The bump-dent structure at the boundary between the low-refractive index layer 15a and the high-refractive index layer 15b can be formed by, for example, forming bump-dent features on the low-refractive index layer 15a, and thereafter filling up the dents and bumps with the high-refractive index material. When subsequently forming the transparent electrode 13, the organic emission layer 12, and the reflection electrode 11, short-circuiting is likely to occur between the transparent electrode 13 and the reflection electrode 11 if the surface of the high-refractive index layer 15b has poor planarity. In that case, the device may not be capable of being lit, thus resulting in a poor production yield during manufacture. Thus, in the present embodiment, a construction is adopted which can minimize the height of the bump-dent features, thus to ensure planarity after filling with the high-refractive index layer 15b. Moreover, lowering the height of the bump-dent structure in this manner also makes it possible to reduce the amounts of materials used of the low-refractive index layer 15a and the high-refractive index layer 15b, thus providing for low cost.

On the other hand, from the standpoint of improving the light extraction efficiency, the height (size) of the bump-dent structure needs to be at least on the order of ¼ times the wavelength of light. This will ensure sufficient optical phase differences for diffracting light, whereby the light-extracting efficiency can be improved. From the above standpoints, in the present embodiment, a diffraction grating with a random structure or a periodic structure, etc., having a height (size) around 1 μm, is adopted as an exemplary bump-dent structure.

Light which has traveled through the bump-dent structure is incident on the low-refractive index layer 15a. If the thickness of the low-refractive index layer 15a is ½ or less of the wavelength of light, light will not propagate through the low-refractive index layer 15a, but will be transmitted through the transparent substrate 14 via an evanescent field, so that the effect of deflecting light toward the lower angles with the low-refractive index layer 15a is no longer expectable. Thus, the thickness of the low-refractive index layer 15a according to the present embodiment may be set to ½ times or more of the average emission wavelength.

[2-1-2. Material and Production Method of Internal Light-Extraction Layer 15]

The refractive index of the high-refractive index layer 15b may be set to 1.73 or more, for example. The material for the high-refractive index layer 15b may be, for example: an inorganic material with a relatively high refractive index, e.g., ITO (indium tin oxide), $TiO_2$ (titanium oxide), SiN (silicon nitride), $Ta_2O_5$ (tantalum pentoxide), or $ZrO_2$ (zirconia); a high-refractive index resin; or the like.

It is commonplace to use glass, resin, and the like as the transparent substrate 14, which have refractive indices on the order of 1.5 to 1.65. Therefore, as the material of the low-refractive index layer 15a, inorganic materials such as glass and $SiO_2$ (quartz), and resins and the like can be used.

As the method of forming the internal light-extraction layer 15, a low-refractive index layer 15a whose surface has bump-dent features may be formed on the transparent substrate 14, for example, and the bump-dent structure may be filled up with a high-refractive index material from above, whereupon the transparent electrode 13, the organic emission layer 12, and the reflection electrode may be formed. In another method, the reflection electrode 11 may be formed on a substrate; the organic emission layer 12, the transparent electrode 13, and a high-refractive index layer 15b whose surface has bump-dent features may be formed thereupon; the bump-dent structure may be filled with a low-refractive index material from above; and the transparent substrate 14 may be formed thereupon.

When inorganic materials are used as the materials of the low-refractive index layer 15a and the high-refractive index layer 15b, a relatively high-cost technique such as cutting or a semiconductor process will generally be required. On the other hand, when the aforementioned resin materials are used as the materials of the low-refractive index layer 15a and the high-refractive index layer 15b, it is possible to form the internal light-extraction layer 15 by a relatively low-cost technique, such as application, nanoimprint, and spin-coating.

[2-2. Analysis of External Light-Extraction Layer 16]

[2-2-1. Analysis of Angular Distribution of Light Incident on External Light-Extraction Layer 16]

Figure 3:
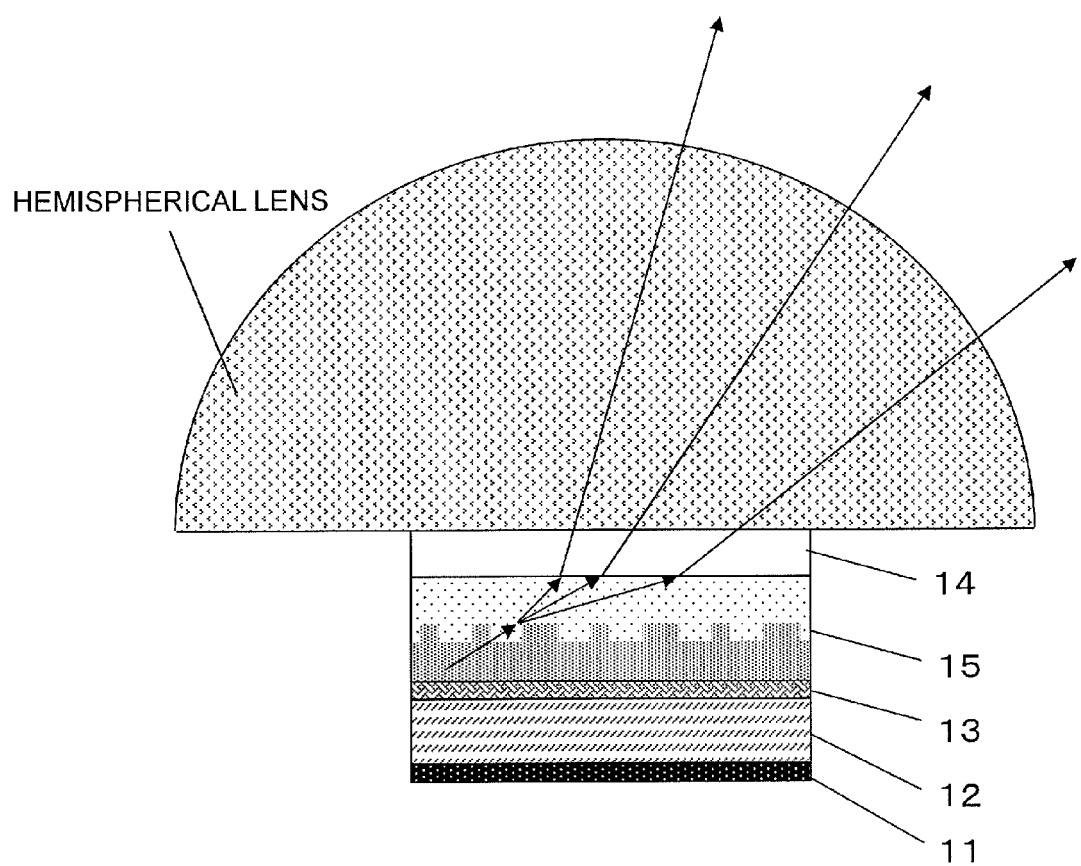
FIG. 3 A diagram showing a method of measuring an angular distribution with which light strikes an external light-extraction layer.

First, the inventors have measured an angular distribution of light incident on the external light-extraction layer 16 under the construction shown in FIG. 3. In the construction shown in FIG. 3, instead of the external light-extraction layer 16 of the organic EL device 100 in FIG. 1, a hemispherical lens which is sufficiently larger than the organic EL device 100 is attached. Herein, the hemispherical lens has substantially the same refractive index as the refractive index of the transparent substrate 14. With this construction it is possible to measure an angular distribution of light going out from the transparent substrate 14, because, without being refracted, light is extracted into the air layer via the hemispherical lens from the transparent substrate 14. A spectroradiometer was used for the light distribution measurement, which was placed so as to receive light from a light spot spanning a sufficiently small region of the emission layer 12.

Figure 8A:
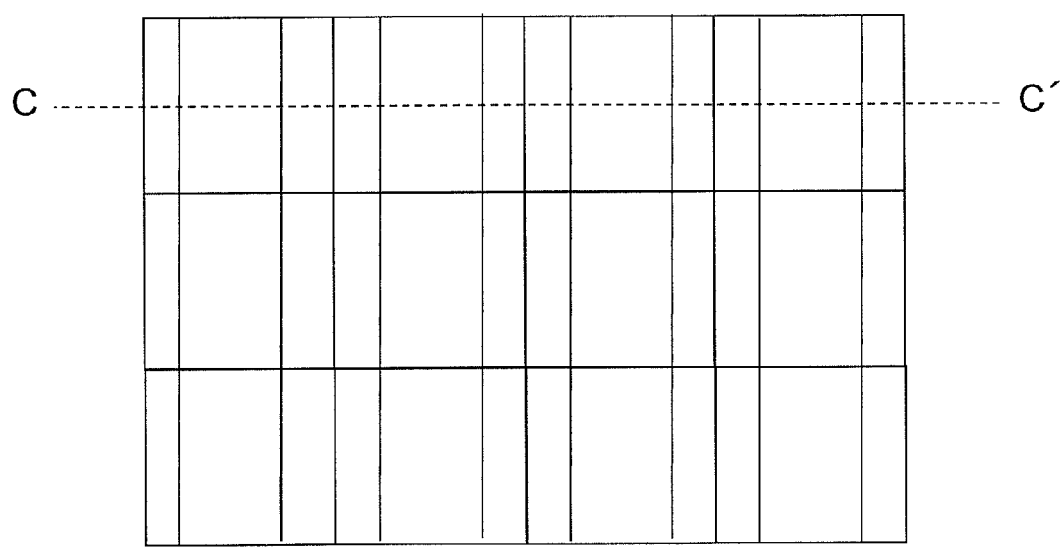
FIG. 8A A plan view showing an exemplary arrangement of trapezoidal prism structures.
Figure 8B:
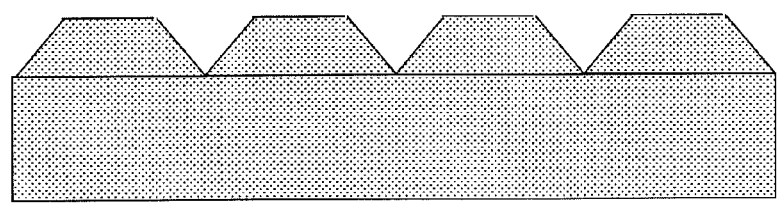
FIG. 8B A cross-sectional view taken along line C-C' in FIG. 8A.

The aforementioned measurement was performed for several prototyped samples of organic EL devices. The results are shown in FIG. 8A. In the graph of FIG. 8A, the horizontal axis represents incident angle, and the vertical axis represents measured light intensity (arbitrary unit) per unit area. As a sample construction, constructions as shown in FIG. 8B and Table 1 below were adopted.

TABLE 1

|  | d1 (nm) | d1' (nm) | d2 (nm) | D2' (nm) | bump-dent structure |
| --- | --- | --- | --- | --- | --- |
| Sample 1 | 56 | 312 | 168 | 200 | Random 1 w = 0.6 μm |
| Sample 2 | 104 | 264 | 168 | 200 | Random 1 w = 0.6 μm |
| Sample 2_0 | 104 | 264 | 168 | 200 | None |
| Sample 2_0 | 104 | 264 | 168 | 200 | Random 2 w = 1.2 μm |
| Sample 3 | 104 | 264 | 207 | 161 | Random 1 w = 0.6 μm |

Herein, glass with a refractive index of 1.51 was used as the transparent substrate 14, and ITO was used as the transparent electrode 13. As the organic emission layer 12, a multilayer structure including two layers respectively emitting light of average wavelengths λ 1=580 nm and λ 2=470 nm was adopted. As used herein, an "average wavelength" is defined so that, in the emission spectrum, a sum of intensities of light of any wavelengths longer than that wavelength is equal to a sum of intensities of light of any wavelengths shorter than that wavelength. The positions of the two emission layers in each sample are as indicated in Table 1, where the distance from the reflection electrode 11 to the layer emitting light of an average wavelength λ1 is denoted as d1; the distance from this layer to the transparent electrode 13 is denoted as d1'; the distance from the reflection electrode 11 to the layer emitting light of a wavelength λ2 is denoted as d2; and the distance from this layer to the transparent electrode 13 is denoted as d2'. As for the internal light-extraction layer 15, a resin with a refractive index of 1.52 was used as the material of the low-refractive index layer 15a and a resin with a refractive index of 1.76 was used as the material of the high-refractive index layer 15b, and a bump-dent structure was formed at the interface therebetween. As the bump-dent structure, two patterns shown in FIGS. 5(a) and (b) were used.

Figure 5:
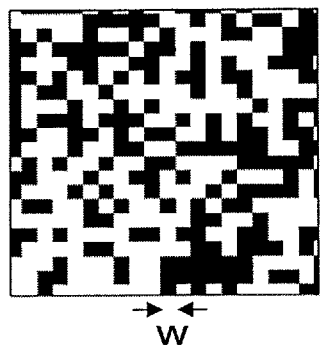
FIG. 5 (a) is a diagram showing bump-dent structures in a first prototyped device; and (b) is a diagram showing bump-dent structures in a second prototyped device.
Figure 5:
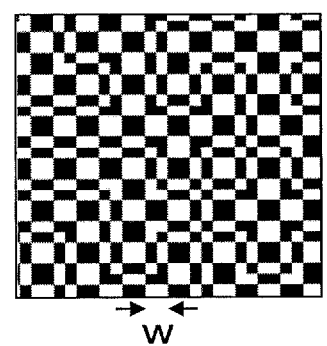

Among Samples 1, 2 and 3, the relative positioning of the two emission layers and the two electrodes is varied, but the bump-dent structure is always the random structure (Random 1) shown in FIG. 5(a). Sample 2_2 has the two emission layers disposed in the same positions as in Sample 2, but the bump-dent structure is changed to the structure (Random 2) shown in FIG. 5(b). The structure of Random 1 is a random arrangement of two kinds of blocks having a width of 0.6 μm and a level difference of 0.6 μm. On the other hand, the structure of Random 2 is a random arrangement of two kinds of blocks having a width of 1.2 μm and a level difference of 0.6 μm. In Random 2, however, randomness is reduced so that no three or more blocks of the same kind successively appear along the lateral direction or the vertical direction in FIG. 5(b). As a comparative example, measurements were also taken of Sample 2_0, which had the internal light-extraction layer 15 excluded from the construction of Sample 2.

Figure 4A:
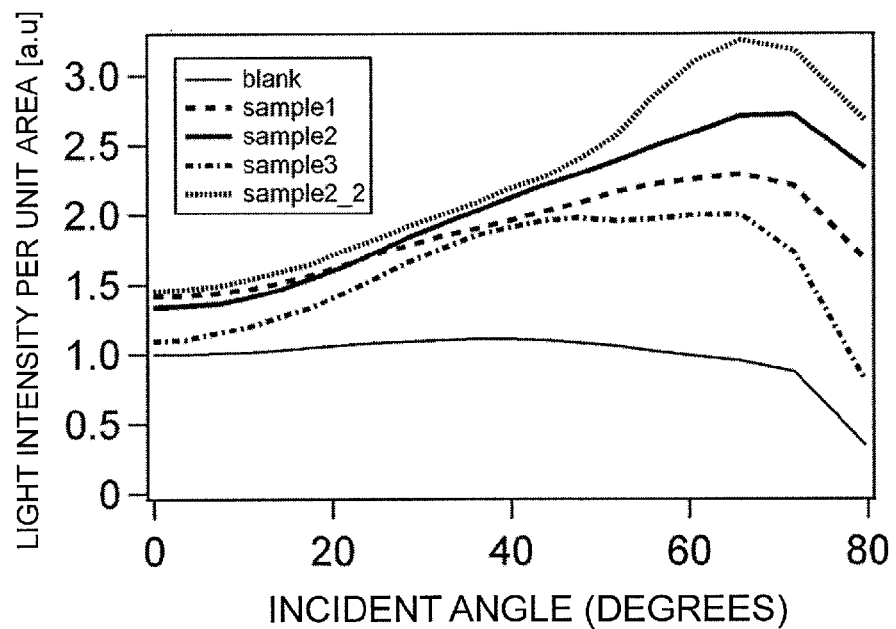
FIG. 4A A graph showing incident angle dependence of light intensity per unit area in several prototyped devices.
Figure 4B:
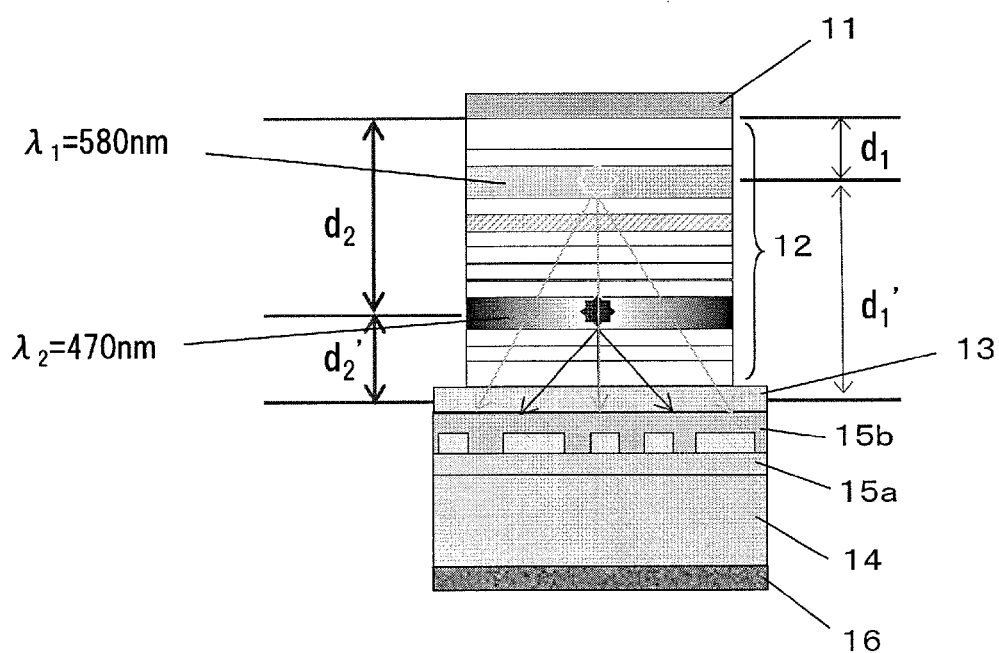
FIG. 4B A diagram showing the construction of a prototyped device.

As shown in FIG. 4A, in Sample 2_0 (blank) lacking the internal light-extraction layer 15, the light intensity does not change much against the incident angle. On the other hand, in the other samples including the internal light-extraction layer 15, light intensity increases mainly at the higher angle side, with a light intensity peak between 60 degrees and 80 degrees. Since this tendency is observed irrespective of the construction of the emission layer 12, it can be said that the internal light-extraction layer 15 is responsible for this effect of extracting light mainly at the higher angle side. As shown in FIG. 4A, the tendency of increasing light intensity on the higher angle side is more outstanding in Sample 2_2 with reduced randomness.

[2-2-2. Analysis of External Light-Extraction Layer 16]

As described above, light which has passed through the internal light-extraction layer 15 has a light intensity peak at an incident angle between 60 degrees and 80 degrees. Therefore, structures were studied which would allow the external light-extraction layer 16 to efficiently extract light being incident at an incident angle between 60 degrees and 80 degrees. After light passes through the transparent substrate 14, it arrives at the external light-extraction layer 16. The external light-extraction layer 16 may be formed by directly processing the transparent substrate 14, or formed by attaching a film having a light extraction structure provided thereon. Herein, based on a transmittance when using a microlens array as a light extraction structure, transmittance calculation was performed for several structures having geometric features on the light-outgoing surface (which hereinafter may be referred to as "surface structures"). As used herein, "geometric features" mean structures of bump-dent shape that are sufficiently larger than the light wavelength (e.g., several times to several dozen times as large as the light wavelength). The surface structures may be composed of a transparent material such as glass or resin, for example. Although the refractive index of the surface structures may be set similar to the refractive index of the transparent substrate 14, the refractive indices of these may also be different. In this calculation, as the surface structures, those having the same refractive index as that of the transparent substrate 14 were used.

Figure 6A:
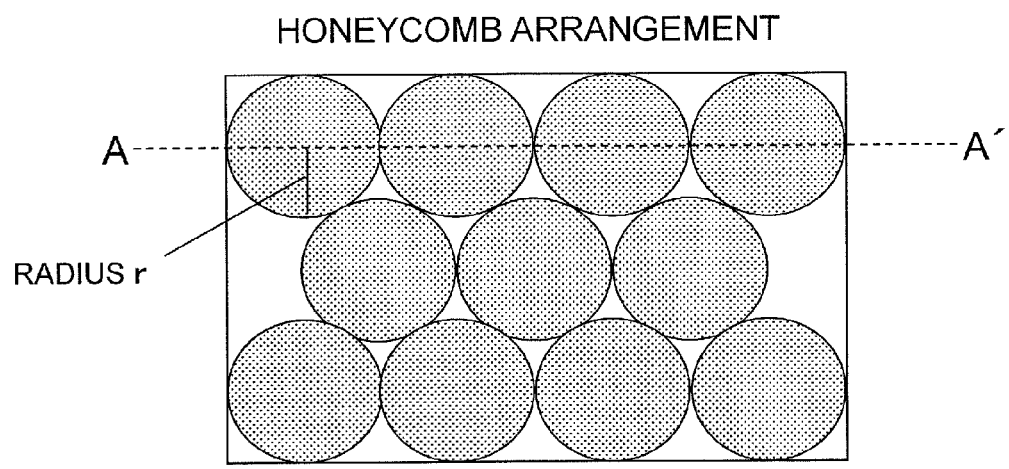
FIG. 6A A plan view showing an exemplary arrangement of a microlens array.
Figure 6B:
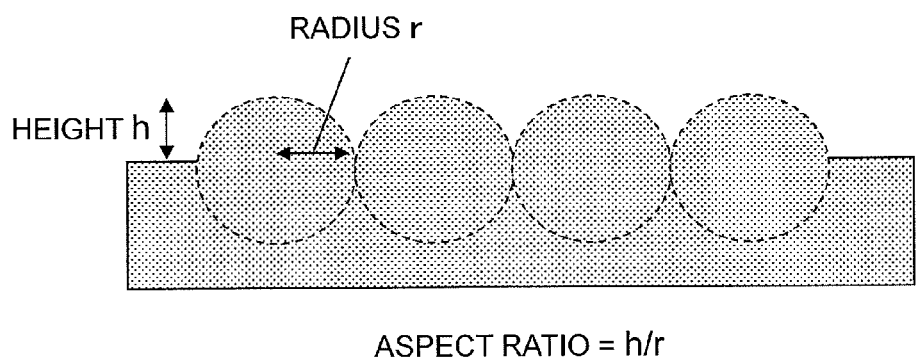
FIG. 6B A cross-sectional view taken along line A-A' in FIG. 6A.
Figure 7A:
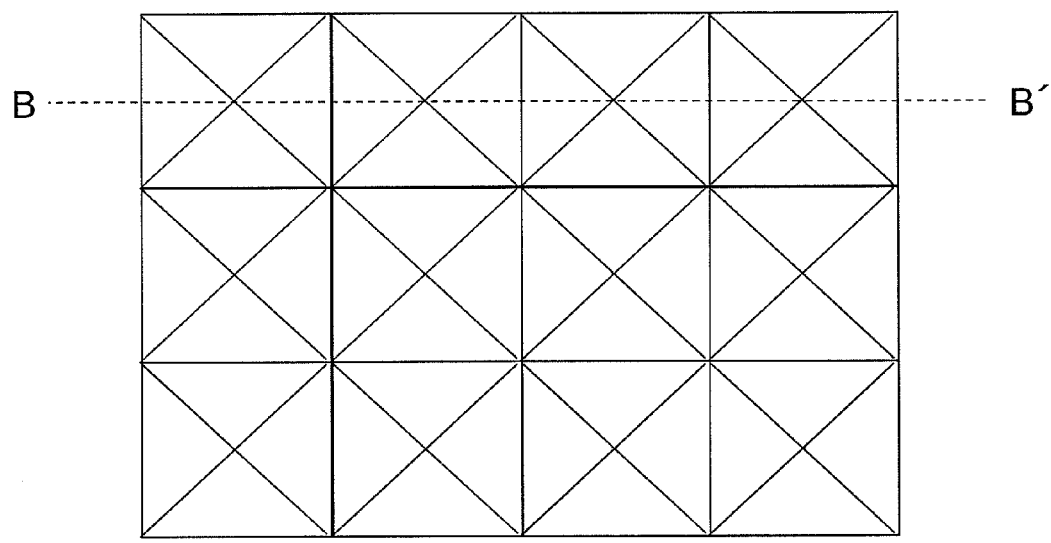
FIG. 7A A plan view showing exemplary pyramidal structures.
Figure 7B:
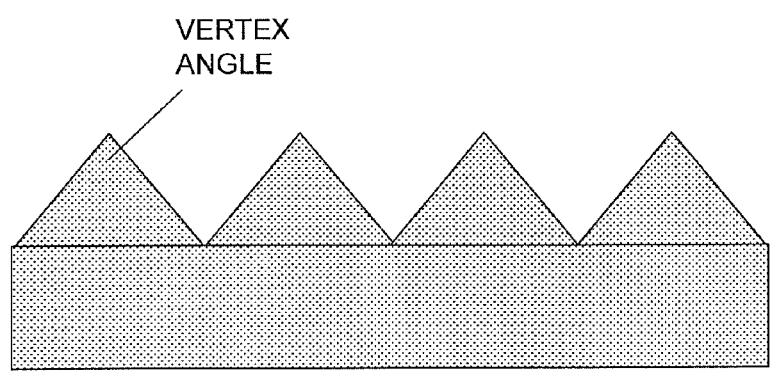
FIG. 7B A cross-sectional view taken along line B-B' in FIG. 7A.

Three types of surface structures were considered: a microlens array structure, pyramidal structures, and trapezoidal prism structures. These were all in close-packed structure. FIG. 6A is a plan view showing an external light-extraction layer 16 having a microlens array structure, and FIG. 6B is a cross-sectional view taken along line A-A in FIG. 6A. An array of circular microlenses attains a close-packed structure under a honeycomb arrangement as shown in FIG. 6A, thus maximizing the light extraction efficiency. In this calculation, microlenses with an aspect ratio h/r of 1 were adopted, where r is the radius of each microlens and h is the height from the surface. FIG. 7A is a plan view of an external light-extraction layer 16 having pyramidal structures, and FIG. 7B is a cross-sectional view taken along line B-B' in FIG. 7A. The analysis adopted an example where the pyramidal structures had a vertex angle of 60 degrees and an example where the pyramidal structures had a vertex angle of 90 degrees. FIG. 8A is a plan view of an external light-extraction layer 16 having trapezoidal prism structures, and FIG. 8B is a cross-sectional view taken along line C-C' in FIG. 8A. Since the transmittance for light which arrives at an incident angle between 60 degrees and 80 degrees is important in the present embodiment, average values of transmittance for arriving at an incident angle between 60 degrees and 80 degrees (which may hereinafter be referred to as "average transmittance") were compared. As the calculation algorithm, a method based on ray tracing was applied.

Figure 9:
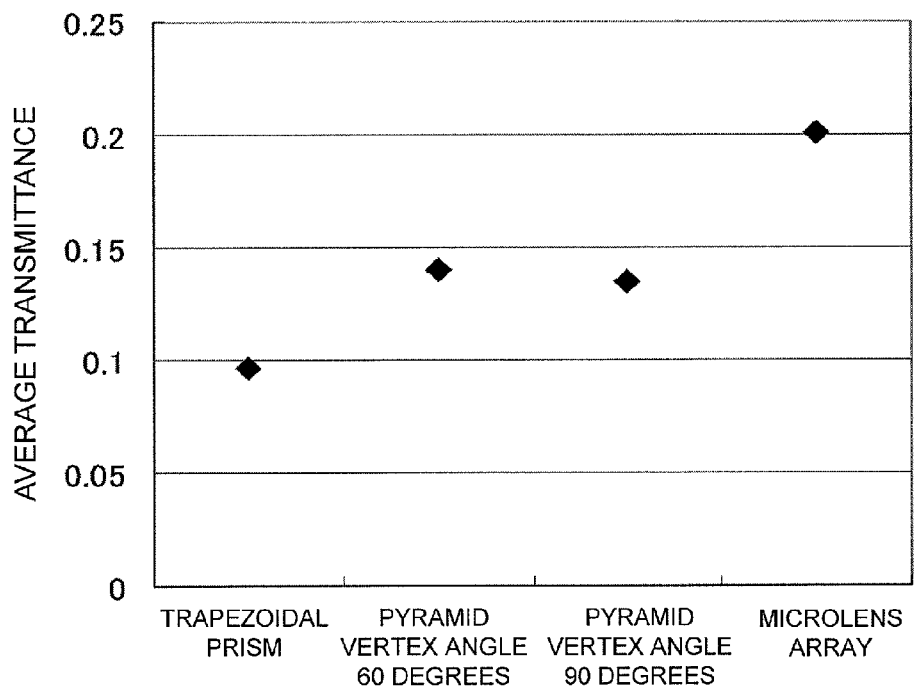
FIG. 9 A diagram showing dependence of average transmittance on surface structures.

FIG. 9 is a graph showing results of the above calculation. In FIG. 9, the horizontal axis represents the type of surface structures, and the vertical axis represents average transmittance. As is indicated by this graph, the largest average transmittance of about 0.2 was achieved when using a microlens array, and the average transmittance of the microlens array was not exceeded in any other example where merely the surface structures were replaced.

[2-2-3. Structure Study of External Light-Extraction Layer 16: Diffusive Particles (Calculation)]

Next, as the structure of the external light-extraction layer 16, that which lacked surface structures but included a plurality of diffusive particles inside was studied. As used herein, "diffusive particles" mean particles (a mass of molecules) having an extinction coefficient near zero (transparent) and a size of about several hundred nm to several dozen μm. Diffusive particles possess a different refractive index from that of the surrounding light-transmitting member, and have such characteristics as to diffuse incident light. As diffusive particles, compounds shown in Table 2 below can be used, for example.

TABLE 2

| | chemical formula | refractive index for a given wavelength |
|---|---|---|
| titanium oxide | $TiO_2$ | 2.52 to 2.71 |
| barium titanate | $BaTi_3$ | 2.41 |
| zirconium oxide | $ZrO_2$ | 2.2 |
| aluminum oxide | $Al_2O_3$ | 1.76 |
| zinc oxide | $ZnO$ | 1.95 |
| titanium nitride | $TiN$ | 1.25 |
| magnesium ifluoride | $MgF_2$ | 1.38 |

Figure 10:
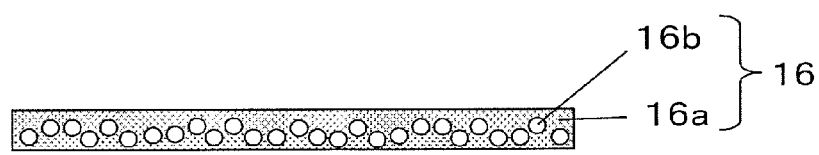

FIG. 10 is a diagram schematically showing an external light-extraction layer 16 containing a plurality of diffusive particles. This external light-extraction layer 16 is constructed so that a plurality of diffusive particles 16b are provided inside a light-transmitting member 16a. In the present specification, a layer which includes the light-transmitting member 16a and the plurality of diffusive particles 16b may be referred to as a "diffusing layer". In the example shown in FIG. 10, the diffusing layer straightforwardly corresponds to the external light-extraction layer 16; however, any member other than the diffusing layer may be added, or some surface structures may be provided, as will be described later. In this analysis, the light-transmitting member 16a surrounding the diffusive particles 16b had a refractive index na of 1.52; the diffusive particles 16b had a refractive index nb of 1 to 3; and the diffusive particles 16b had a radius r of 0.5 μm to 10.5 μm. The volume fraction of the diffusive particles 16b, i.e., a rate (which hereinafter may be referred to as a "packing fraction") p which the total volume of the plurality of diffusive particles 16b accounts for in the volume of the diffusing layer, was 0.05 to 0.75. The diffusing layer had a thickness (film thickness) d of 30 μm.

Figure 11:
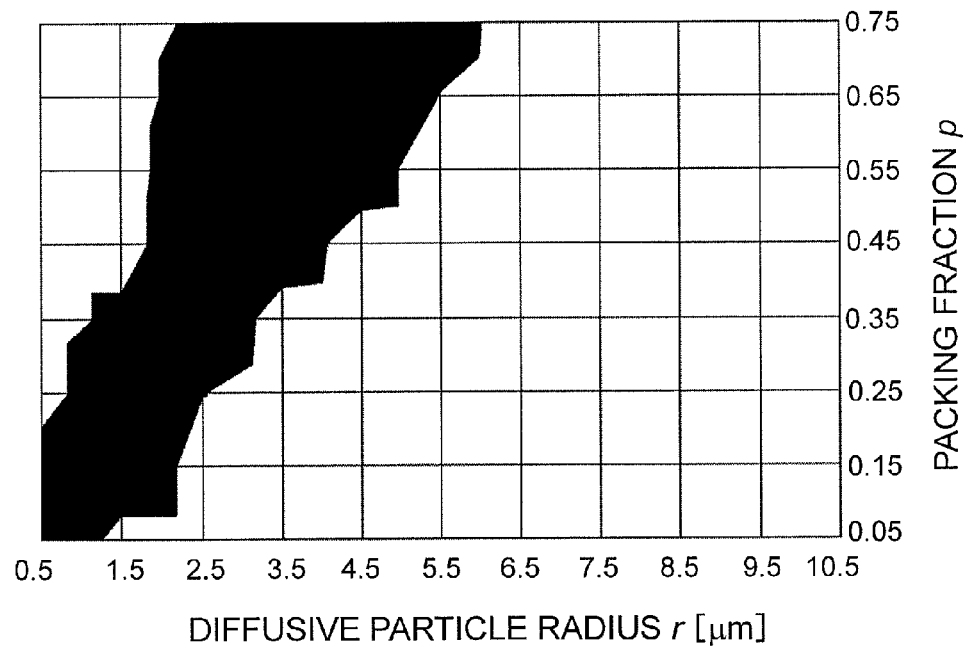
FIG. 11 A graph showing a range of radii and packing fractions of diffusive particles in which a higher average transmittance is obtained than in the case where a microlens array is used.

FIG. 11 is a graph showing a range of radii r and packing fractions p of the diffusive particles in which a higher average transmittance is obtained than in the case where the aforementioned microlens array is used, with respect to diffusive particles having a refractive index nb of 1.8. In FIG. 11, the horizontal axis represents the diffusive particle radius r [μm] and the vertical axis represents the packing fraction p, and a region of those values which provide a higher average transmittance than in the case of using a microlens array is shown black. In a region with moderate diffusion effects, the diffusing layer had a higher average transmittance than the average transmittance of the microlens array. However, in a region where the diffusive particle radius r was small and the packing fraction p was high, i.e., a region of very high diffusion effects, the average transmittance was lower than that of the microlens array, because light would not be transmitted through the diffusing layer in the first place. Conversely, in a region where the diffusive particle radius r was large and the diffusion effect was small, the average transmittance was lower than that of the microlens array, because light would undergo total reflection at the interface with air, without being sufficiently diffused.

Now, diffusing power D, a quantity as defined by eq. (1) below, is introduced.

[math. 2]

$$D = \frac{|n_a - n_b|}{n_a} \cdot p \cdot \frac{d}{r} \quad (1)$$

That is, it is defined that: diffusing power=(absolute value of refractive index difference between diffusive particles and diffusing layer)/diffusing layer refractive index×packing fraction×diffusing layer film thickness/diffusive particle radius. The diffusing power D can be utilized as an index of strength of diffusing property of the diffusing layer.

Figure 12:
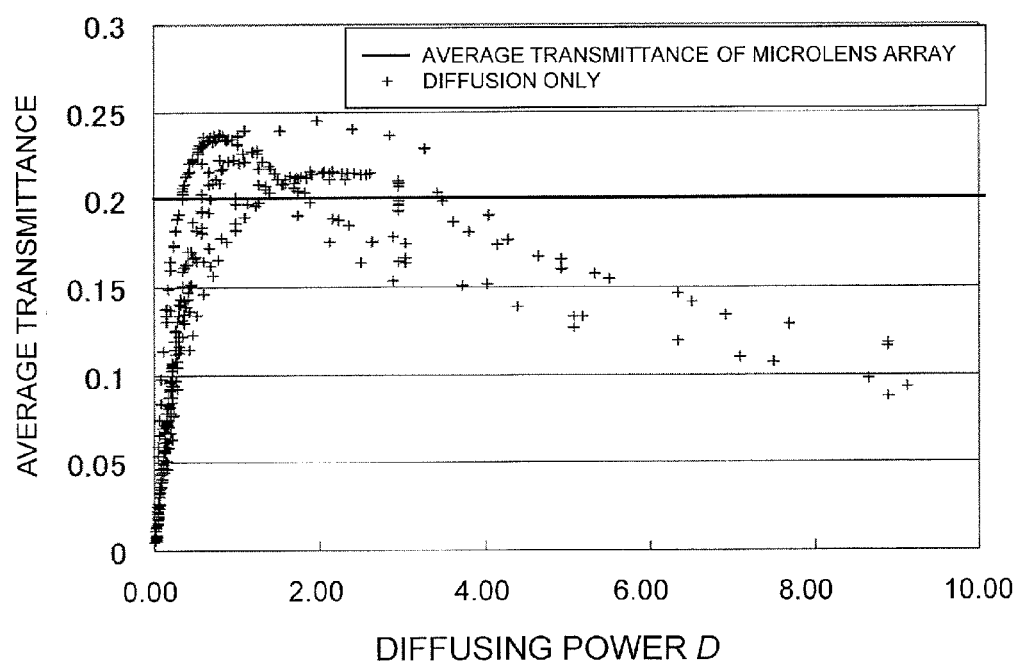
FIG. 12 A graph showing dependence of average transmittance on diffusing power.

FIG. 12 is a graph showing the calculation results, where the horizontal axis represents diffusing power D and the vertical axis represents average transmittance. For comparison's sake, the average transmittance when using a microlens array is indicated by a black line. Similarly to the results shown in FIG. 11, it can be seen that the average transmittance decreases when the diffusing power is very strong, or when the diffusing power is very weak. As shown in FIG. 12, it was found that, in the case where the external light-extraction layer 16 lacks surface structures and only contains diffusive particles, the average transmittance when using a microlens array is exceeded when the diffusing power is not less than 0.34 and not more than 3.5.

[2-2-4. Structure Study of External Light-Extraction Layer 16: Diffusive Particles and Surface Structures (Calculation)]

Figure 13:
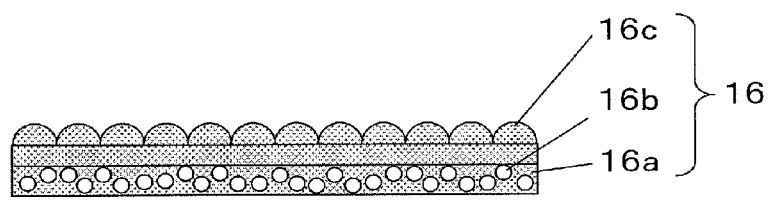
FIG. 13 A diagram schematically showing a portion of an external light-extraction layer 16 in which a diffusing layer and a microlens array structure are combined.

Next, structures for an external light-extraction layer 16 to have both surface structures and diffusive particles were studied. As shown in FIG. 13, an average transmittance was calculated for an external light-extraction layer 16 which combined surface structures 16c with a diffusing layer having a light-transmitting member 16a and a plurality of diffusive particles 16b. The surface structures 16c were a microlens array in close-packed structure, similarly to those shown in FIG. 6A and FIG. 6B. Similarly to the aforementioned calculation, the light-transmitting member 16a in the diffusing layer had a refractive index na of 1.52; the diffusive particles 16b had a refractive index nb of 1 to 3; and the diffusive particles 16b had a radius r of 0.5 μm to 10.5 μm. Moreover, the diffusive particles 16b had a packing fraction p of 0.05 to 0.75, and the diffusing layer had a film thickness d of 30 μm.

Figure 14:
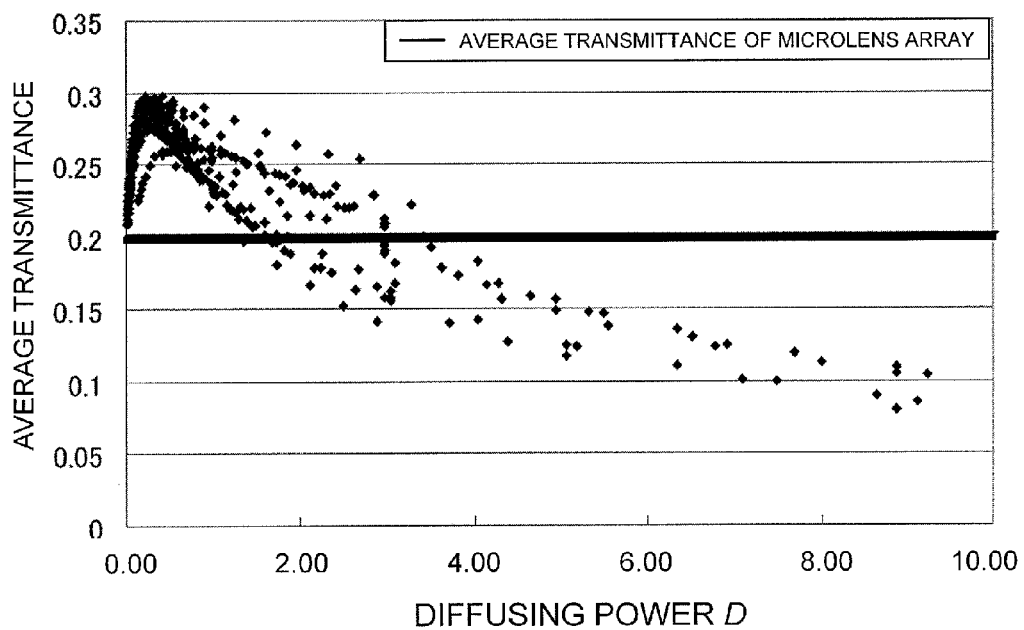
FIG. 14 A graph showing dependence of average transmittance on diffusing power, in an external light-extraction layer 16 in which a diffusing layer and a microlens array structure are combined.

FIG. 14 is a graph showing the calculation results, where the horizontal axis represents diffusing power D and the vertical axis represents average transmittance. Again, for comparison's sake, an average transmittance when using a microlens array alone is indicated by a black line. It can be seen from FIG. 14 that it is when the diffusing power D is greater than 0 but not more than 3.5 that the average transmittance of the external light-extraction layer 16 exceeds the average transmittance when using a microlens array alone. A particularly high average transmittance was exhibited when the diffusing power D was in the range from 0.05 to 1.0. It was found from the results of FIG. 12 and that the structure having both diffusive particles and surface structures attains a higher average transmittance than does a structure having diffusive particles alone.

[2-2-5. Structure Study of External Light-Extraction Layer 16: Film Thickness Dependence when Diffusive Particles and Surface Structures are Provided (Calculation)]

In order to study dependence on the film thickness of the diffusing layer when diffusive particles and surface structures are provided as the external light-extraction layer 16, an average transmittance was calculated while varying the film thickness d of the diffusing layer and the radius r of the diffusive particles, where the same conditions as in the calculation shown in FIG. 11 were adopted for the refractive index and packing fraction. In the calculation herein, (diffusing layer film thickness; diffusive particle radius) were varied among (2 μm; 0.5 μm to 1.5 μm), (30 μm; 0.5 μm to 10.5 μm), and (300 μm; 0.5 μm to 20.5 μm).

Figure 15:
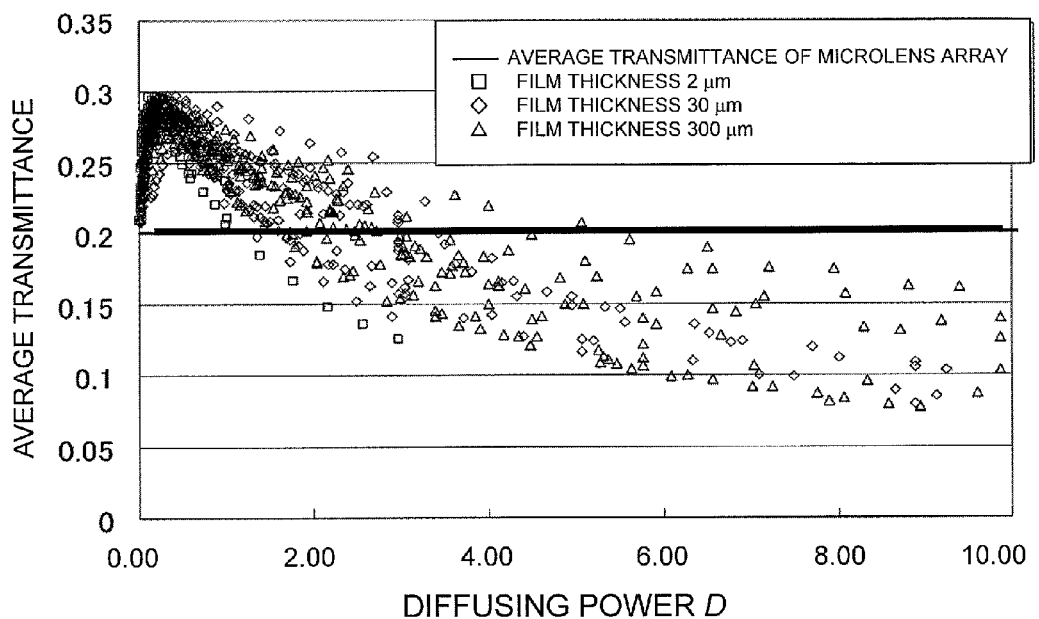
FIG. 15 A graph showing changes in dependence of average transmittance on diffusing power, where the film thickness of the diffusing layer is varied.

FIG. 15 is a graph showing the calculation results. Again, for comparison's sake, an average transmittance when using a microlens array alone is indicated by a black line. It was found from FIG. 15 that, when the film thickness d of the diffusing layer is 2 μm, the average transmittance when using a microlens array alone is exceeded if the diffusing power D is 1.2 or less. It was also found that, when the film thickness d of the diffusing layer is 300 μm, the average transmittance when using a microlens array alone is often exceeded if the diffusing power D is 5.0 or less.

Figure 16:
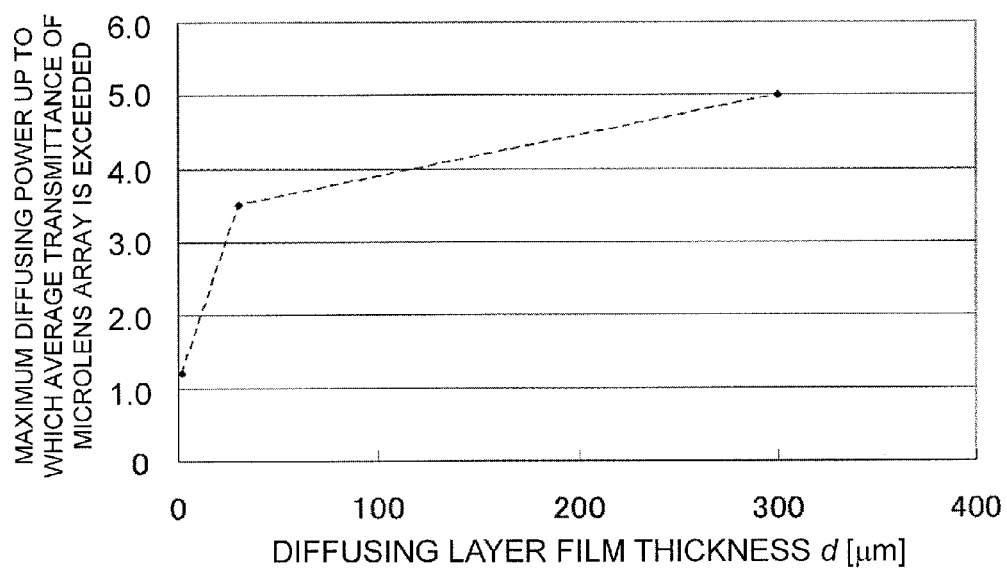
FIG. 16 A graph showing dependence, on the film thickness of the diffusing layer, of maximum diffusing power up to which the average transmittance of a microlens array is exceeded.

FIG. 16 shows a graph where the horizontal axis represents diffusing layer film thickness d and the vertical axis represents the maximum diffusing power up to which the average transmittance when using a microlens array alone is exceeded. This maximum diffusing power tends to increase as the diffusing layer film thickness d increases. It can be seen that, in the case where the film thickness of the diffusing layer is 300 μm or less, a higher average transmittance than the average transmittance when using a microlens array alone is obtained if the diffusing power is smaller than a certain value equal to or less than 5.0. In the case where the film thickness of the diffusing layer is 300 μm or more, too, a higher average transmittance than the average transmittance when using a microlens array alone will be obtained if the diffusing power is equal to or less than 5.0, to say the least.

[2-2-6. Structure Study of External Light-Extraction Layer 16: Surface Packing Fraction Dependence when Diffusive Particles and Surface Structures are Provided (Calculation)]

The inventors further conducted the following calculation in order to examine the dependence of average transmittance on the packing fraction of the surface structures of the external light-extraction layer 16. As used herein, the "packing fraction of the surface structures" means an area ratio that a portion having any geometric features accounts for in the entire surface of the external light-extraction layer 16. For example, in the microlens array shown in FIG. 6A, the portion where circular microlens protruding from the surface are provided corresponds to the "portion having any geometric features". As the conditions of calculation, the conditions which exhibited the highest average transmittance in FIG. 15 were used: refractive index nb=1.6; diffusive particle radius r=3.5 μm; diffusing layer film thickness d=30 μm; diffusive particles packing fraction p=0.45. The packing fraction of the surface structures was varied in the range from 30% to 90.7% (close-packed structure).

Figure 17:
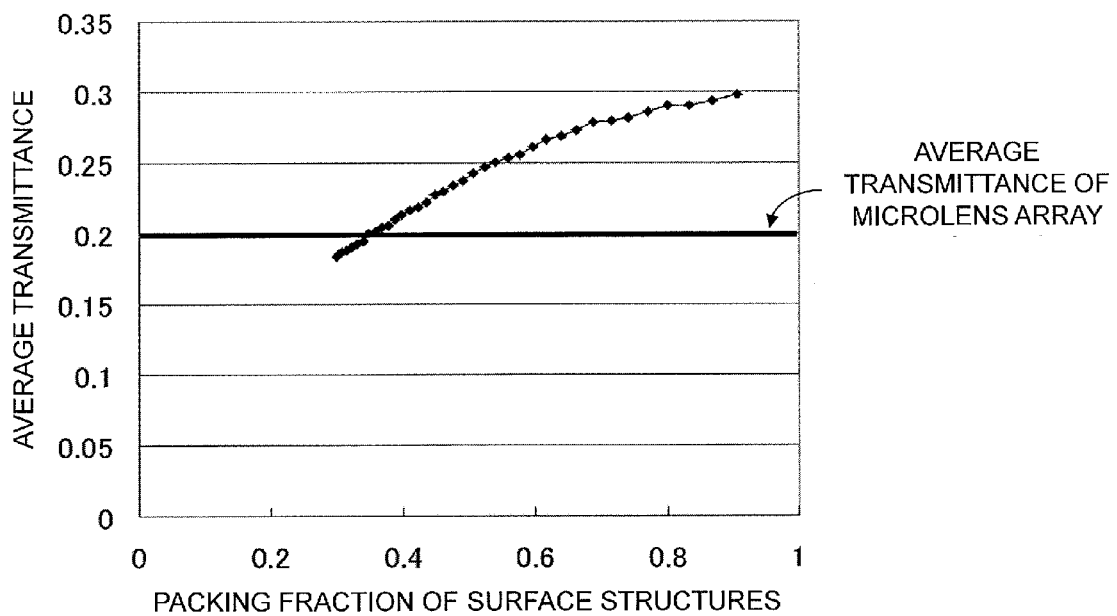
FIG. 17 A graph showing dependence of average transmittance on the packing fraction of surface structures.

FIG. 17 is a graph showing the calculation results. The horizontal axis represents the packing fraction of the surface structures, and the vertical axis represents average transmittance. Again, for comparison's sake, an average transmittance when using a microlens array alone is indicated by a black line. From FIG. 17, there is a tendency that the average transmittance decreases as the packing fraction of the surface structures decreases, this being due to decreasing effects of the surface structures. It was found that, when the packing fraction of the surface structures is below 36%, the average transmittance is lower than the average transmittance when a microlens array alone is provided. In this case, accordingly, the packing fraction of the surface structures may be made equal to or greater than 36% in order to obtain a higher efficiency of light utility than when a microlens array alone is provided. Since this calculation was conducted under conditions where the highest average transmittance would be exhibited, the aforementioned range of being equal to or greater than 36% encompasses desirable ranges for the packing fraction of the surface structures under other conditions.

[2-2-7. Structure Study of External Light-Extraction Layer 16: Surface Structures Dependence when Diffusive Particles and Surface Structures are Provided]

Figure 18:
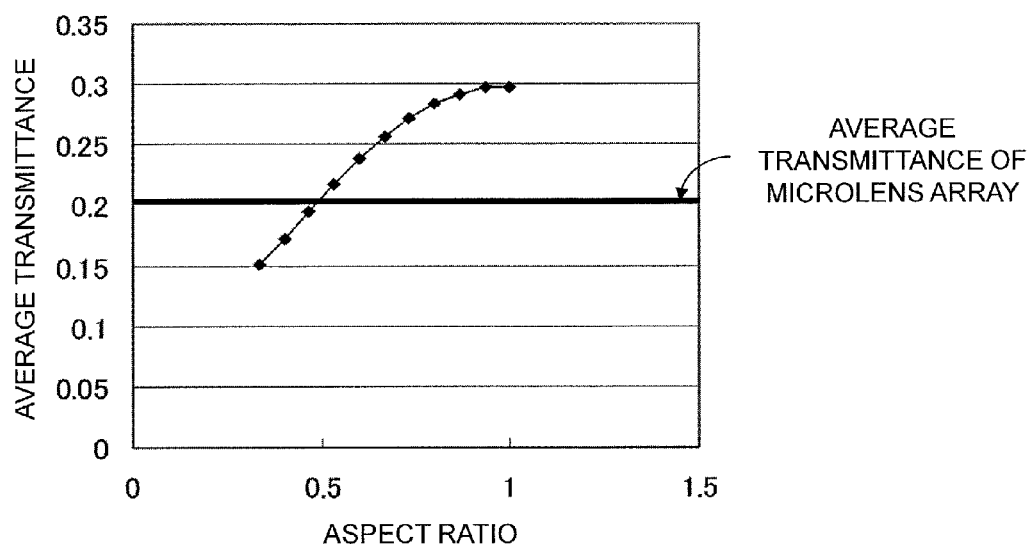
FIG. 18 A graph showing dependence of average transmittance on the aspect ratio of microlenses.

Next, dependence of average transmittance on the surface structures of the external light-extraction layer 16 will be described. FIG. 18 is a graph showing the dependence of average transmittance on the amount of protrusion (height h) of each microlens sphere in the case of using a microlens array in a honeycomb arrangement as shown in FIGS. 6A and 6B.

For comparison's sake, the average transmittance of the microlens array is indicated by a black line. The horizontal axis represents the aspect ratio (height h÷radius r of the sphere). As the conditions concerning the diffusing layer and the like, similarly to the conditions in the calculation shown in FIG. 17, the conditions which exhibited the highest average transmittance in FIG. 15 were used: refractive index nb=1.6; diffusive particle radius r=3.5 μm; diffusing layer film thickness d=30 μm; diffusive particles packing fraction p=0.45.

From FIG. 18, the average transmittance increases as the aspect ratio increases, such that the highest light extraction efficiency is obtained when the aspect ratio is 1 (i.e., a structure featuring hemispheres). It can be seen from this result that, when the aspect ratio is 0.5 or more, the average transmittance of the construction where a microlens array alone is provided is exceeded.

As the surface structures of the external light-extraction layer 16, the present embodiment has illustrated a microlens array as an example. Using a microlens array as the surface structures increases the transmittance for light which arrives at an incident angle between 60 degrees and 80 degrees; when combined with the light exiting the internal light-extraction layer 15 having an intensity distribution peak between 60 degrees and 80 degrees, this provides a higher efficiency over other constructions. Therefore, similarly to a microlens array, any surface structures having a high transmittance for light which arrives at an incident angle between 60 degrees and 80 degrees may be used to provide a higher efficiency over other constructions.

Figure 19:
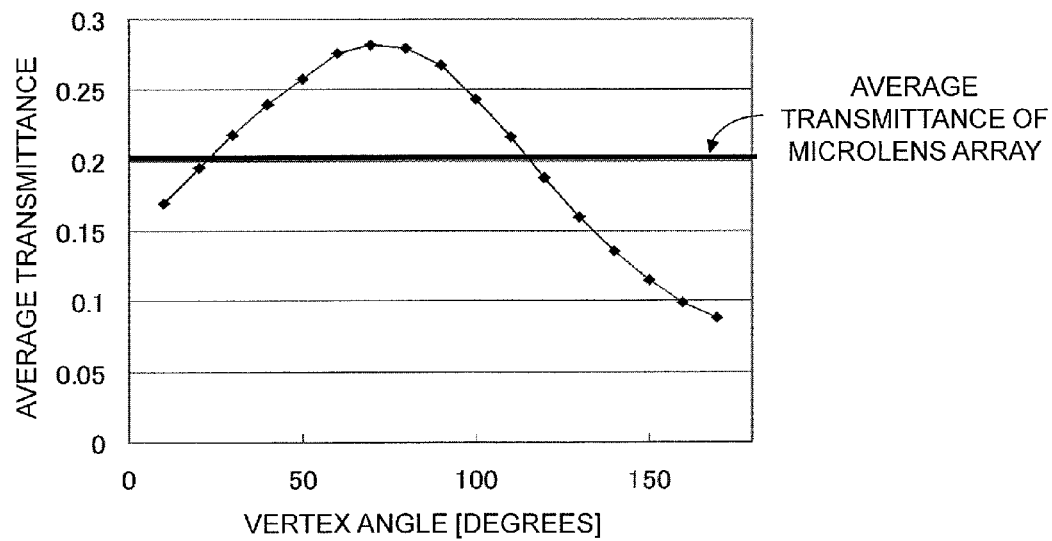
FIG. 19 A graph showing dependence of average transmittance on the vertex angle of pyramidal structures.

This point will be described with respect to a structure featuring an array of pyramid shapes, as a similar configuration to a microlens array. FIG. 19 is a graph showing calculation results of average transmittance in the case where pyramidal structures, shaped as square pyramids as shown in FIG. 7B, are used instead of a microlens array, under similar conditions to those of the aforementioned calculation. The horizontal axis represents the vertex angle of the pyramidal structures, and the vertical axis represents average transmittance. It was found from these results that a higher average transmittance than the average transmittance when using a microlens array alone is obtained if the vertex angle is in the range from 25 to 115 degrees. Note that the shape of the pyramidal structures is not limited to square pyramids; other kinds of pyramids or cone shapes may be used so long as similar transmission characteristics are obtained.

Figure 20A:
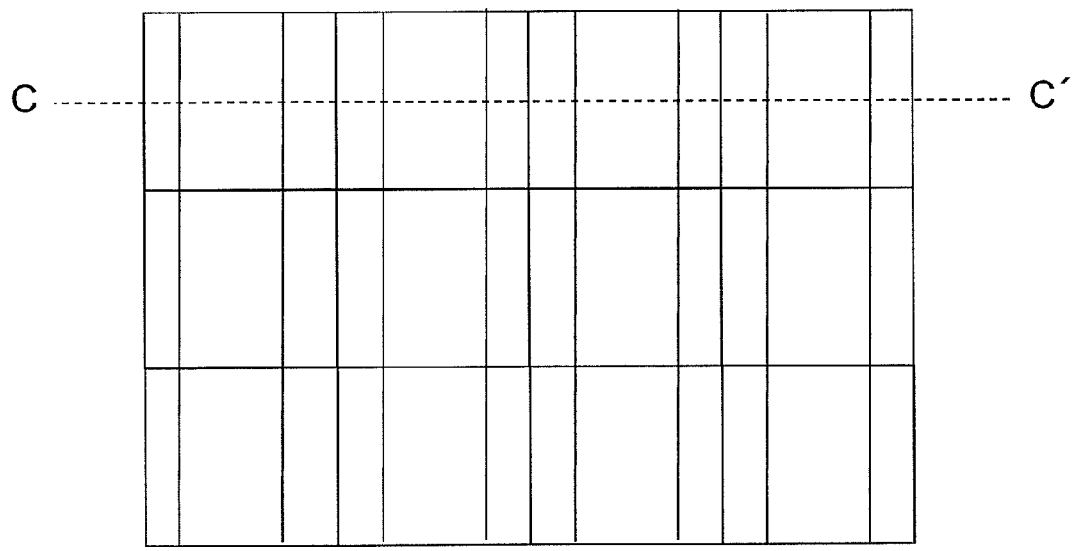
FIG. 20A A plan view showing an example where trapezoidal prism structures are adopted as an external light-extraction layer.
Figure 20B:
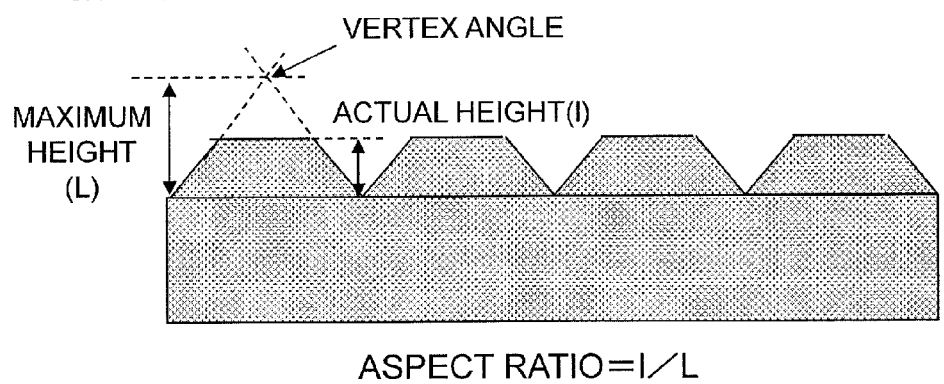
FIG. 20B A cross-sectional view taken along line C-C in FIG. 20A.
Figure 20C:
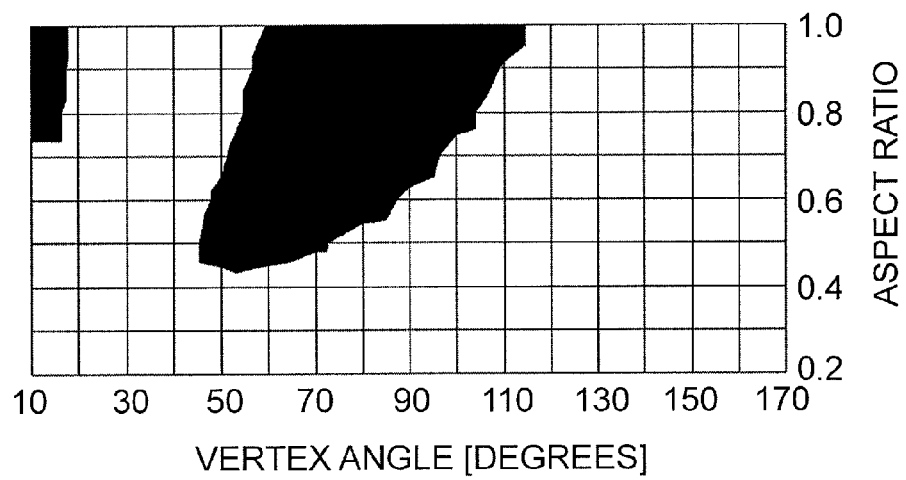
FIG. 20C A graph showing vertex angle and aspect ratio conditions upon which an average transmittance when adopting trapezoidal prism structures exceeds an average transmittance when using a microlens array alone.

Next, trapezoidal prism structures will be discussed. FIG. 20A is a plan view showing an external light-extraction layer 16 having a surface with trapezoidal prism shapes. FIG. 20B is a cross-sectional view taken along line C-C' in FIG. 20A. In this example, an array of trapezoidal prisms is formed as surface structures on the external light-extraction layer 16. As is shown in the figure, a cross section of each trapezoidal prism structure taken along line C-C' presents a shape (trapezoid) resulting from cutting off the vertex of an isosceles triangle. Herein, the angle of the vertex of this isosceles triangle is said to be the "vertex angle" of the resultant trapezoidal prism, with an aspect ratio being defined as l/L, where L is the height (maximum height) of the isosceles triangle and l is the height (actual height) of the trapezoid. FIG. 20C is a graph, in the case where trapezoidal prism structures are adopted, showing a range of vertex angles and aspect ratios where a higher average transmittance than the average transmittance when using a microlens array alone is obtained. In this graph, the horizontal axis represents the vertex angle and the vertical axis represents the aspect ratio, and the region in which a higher average transmittance is obtained than when using a microlens array alone is shown black. In the blackened region, a higher transmittance than the transmittance when using a microlens array alone is attained, for light which arrives at an incident angle between 60 degrees and 80 degrees.

It can be seen from FIG. 20C that a generally satisfactory average transmittance is attained when the following conditions are met: "the vertex angle is not less than 10 degrees and not more than 18 degrees, and the aspect ratio is not less than 0.73 but less than 1"; or, "the vertex angle is not less than 45 degrees and not more than 115 degrees, and the aspect ratio is not less than 0.44 but less than 1". In particular, the average transmittance is further improved when "the vertex angle is not less than 60 degrees and not more than 100 degrees, and the aspect ratio is not less than 0.6 but less than 1". Even more preferably, an array of trapezoidal prisms may be used that satisfies the conditions: "the vertex angle is not less than 70 degrees and not more than 90 degrees, and the aspect ratio is not less than 0.7 but less than 1".

Figure 20D:
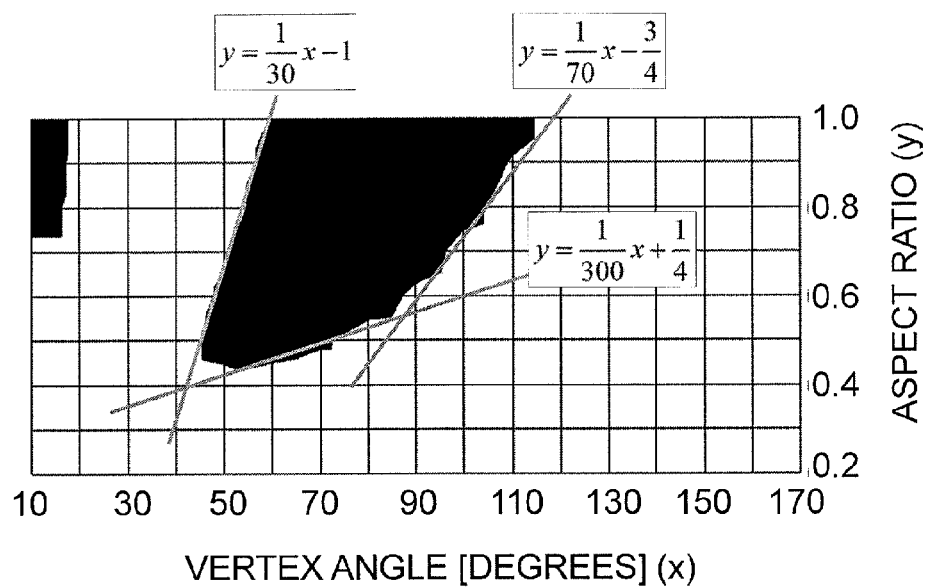
FIG. 20D A diagram for describing the results shown in FIG. 20C in further detail.

FIG. 20D is a diagram for describing the results shown in FIG. 20C in further detail. Given a vertex angle x [degrees] and an aspect ratio y, it may be said that the black region in the central portion of the figure approximates to a region surrounded by four straight lines which are expressed by eqs. (2) to (5) below.

[math. 3]
$$y = \frac{1}{30}x - 1 \quad (2)$$

[math. 4]
$$y = \frac{1}{70}x - \frac{3}{4} \quad (3)$$

[math. 5]
$$y = \frac{1}{300}x + \frac{1}{4} \quad (4)$$

[math. 6]
$$y = 1 \quad (5)$$

Therefore, in this exemplary construction, the vertex angle and aspect ratio may be set within a region of values surrounded by the four straight lines expressed by eqs. (2) to (5).

The above-described trapezoidal prisms each have a cross-sectional shape which is a shape obtained by cutting off the vertex of an isosceles triangle, i.e., an isosceles trapezoid; however, their cross-sectional shape does not need to be an isosceles trapezoid so long as similar transmission characteristics are attained. Moreover, surface structures with an aspect ratio of 1, i.e., triangular cross-sectional shapes (structure defined by an arrangement of triangular prisms), may be adopted.

Figure 21A:
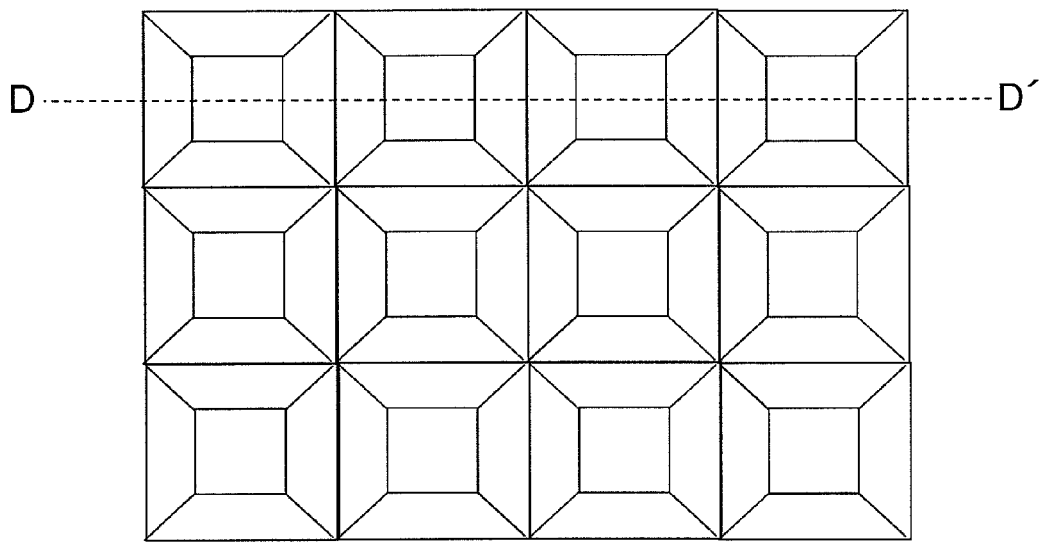
FIG. 21A A plan view showing an example where structures obtained by removing the vertices of pyramidal structures are adopted as an external light-extraction layer.
Figure 21B:
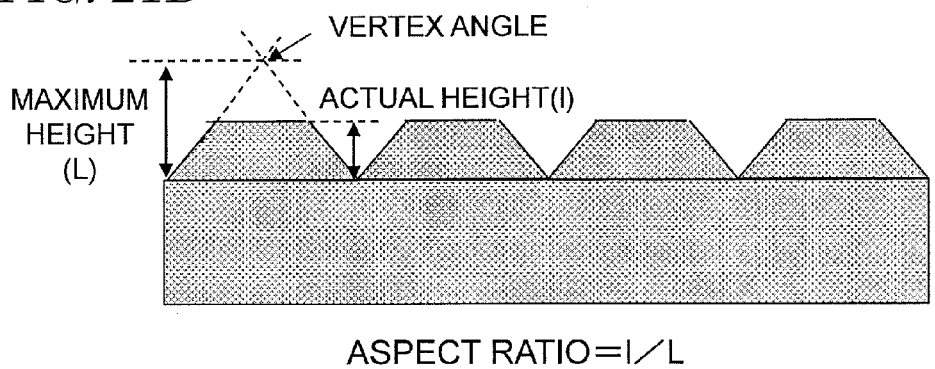
FIG. 21B A cross-sectional view taken along line D-D in FIG. 21A.
Figure 21C:
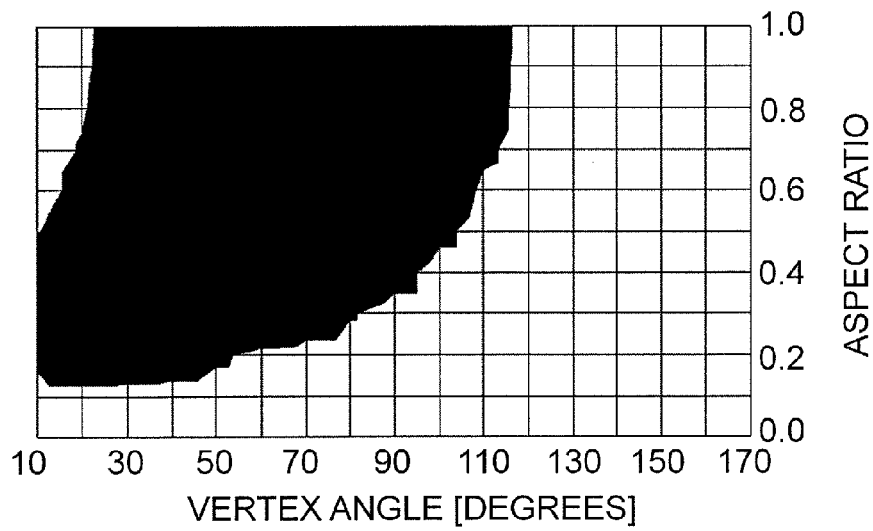
FIG. 21C A graph showing vertex angle and aspect ratio conditions upon which an average transmittance when adopting structures obtained by removing the vertices of pyramidal structures exceeds an average transmittance when using a microlens array alone.

FIGS. 21A and 21B are diagrams showing another exemplary construction of the external light-extraction layer 16. FIG. 21A is a plan view of the external light-extraction layer 16, and FIG. 21B is a cross-sectional view taken along line D-D' in FIG. 21A. The external light-extraction layer 16 in this example includes structures resulting from cutting off the vertices of pyramidal structures. Their cross-sectional shape is a shape resulting from cutting off the vertex of a triangle (i.e., a trapezoid). Herein, the aspect ratio is defined as l/L, where L is the height of the triangle and l is the height of the trapezoid. FIG. 21C is a graph, in the case where these structures are adopted, showing a range of vertex angles and aspect ratios where a higher average transmittance than the average transmittance when using a microlens array alone is obtained. In this graph, the horizontal axis represents the vertex angle and the vertical axis represents the aspect ratio, and the region in which a higher average transmittance than the average transmittance when using a microlens array alone is obtained is shown black. In the blackened region, a higher transmittance than the transmittance when using a microlens array alone is attained for light which arrives at an incident angle between 60 degrees and 80 degrees.

It can be seen from FIG. 21C that a generally satisfactory average transmittance is attained when the following condition is met: "the vertex angle is not less than 10 degrees and not more than 115 degrees, and the aspect ratio is not less than 0.12 but less than 1". In particular, the average transmittance is further improved when "the vertex angle is not less than 30 degrees and not more than 90 degrees, and the aspect ratio is not less than 0.4 but less than 1".

Figure 21D:
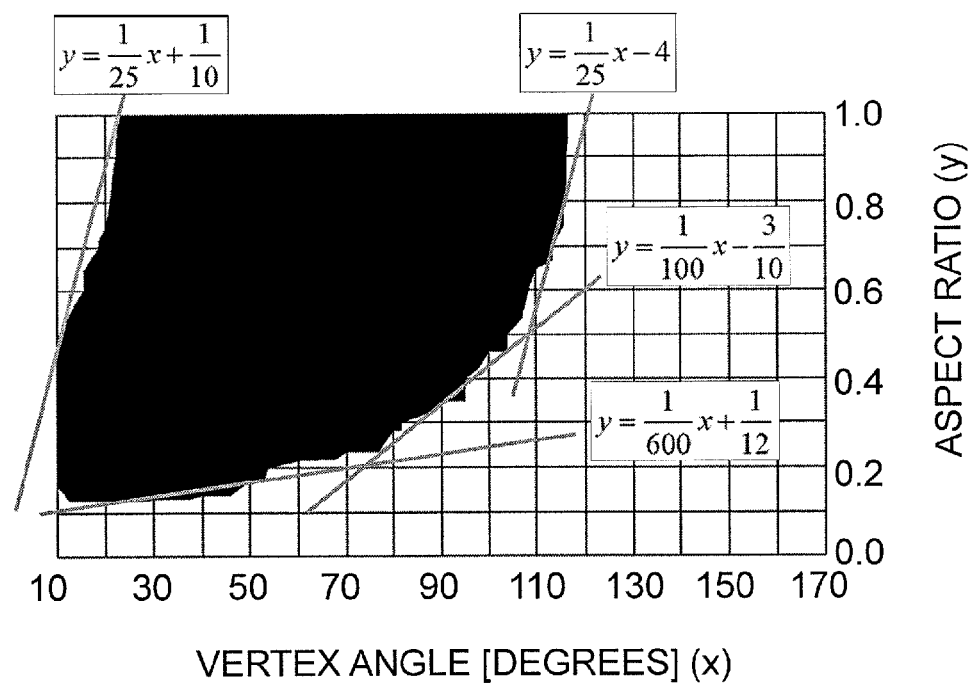
FIG. 21D A diagram for describing the results shown in FIG. 21C in further detail.

FIG. 21D is a diagram for describing the results shown in FIG. 21C in further detail. Given a vertex angle x [degrees] and an aspect ratio y, it may be said that the black region in the figure approximates to a region surrounded by five straight lines which are expressed by eqs. (6) to (10) below.

[math. 7]
$$y = \frac{1}{25}x + \frac{1}{10} \quad (6)$$

[math. 8]
$$y = \frac{1}{25}x - 4 \quad (7)$$

[math. 9]
$$y = \frac{1}{100}x - \frac{3}{10} \quad (8)$$

[math. 10]
$$y = \frac{1}{600}x + \frac{1}{12} \quad (9)$$

[math. 11]
$$y = 1 \quad (10)$$

Therefore, in this exemplary construction, the vertex angle and aspect ratio may be set within a region of values surrounded by the five straight lines expressed by eqs. (6) to (10).

The above-described surface structures each have a cross-sectional shape which is an isosceles trapezoid; however, their cross-sectional shape does not need to be an isosceles trapezoid so long as similar transmission characteristics are attained. Moreover, without being limited to structures resulting from cutting off the vertices of square pyramids, any structures resulting from cutting off the vertices of pyramids, cones, or the like may be adopted, so long as similar transmission characteristics are attained.

[3. Variants]

[3-1. Variant of Diffusive Particles in External Light-Extraction Layer 16]

In the present embodiment, microspheres are exemplified as the diffusive particles. This is in order to diffuse light on the high distribution angle side (with an incident angle of 60 degrees to 80 degrees) so as to result in low distribution angles. Therefore, also in various shapes that similarly possess a diffusive action as do microspheres, this provides a higher light extraction efficiency over other constructions.

In the case where each diffusive particle is of a shape different from a microsphere, a diffusing power D may be determined by regarding the radius of a sphere which is inscribed in that structure as the aforementioned r.

Note that it is not essential to use a diffusing layer containing a plurality of diffusive particles as the external light-extraction layer 16. If the surface structures are adapted so that 20% or greater transmittance is obtained for light which arrives at an incident angle of to 80 degrees, there is no need to use diffusive particles. An example of such an external light-extraction layer 16 is a microlens array in close-packed structure as shown in FIGS. 6A and 6B. Surface structures other than a microlens array may also be adopted.

[3-2. Variant of Bump-Dent Structure]

Next, a variant of the bump-dent structure will be described.

Figure 22:
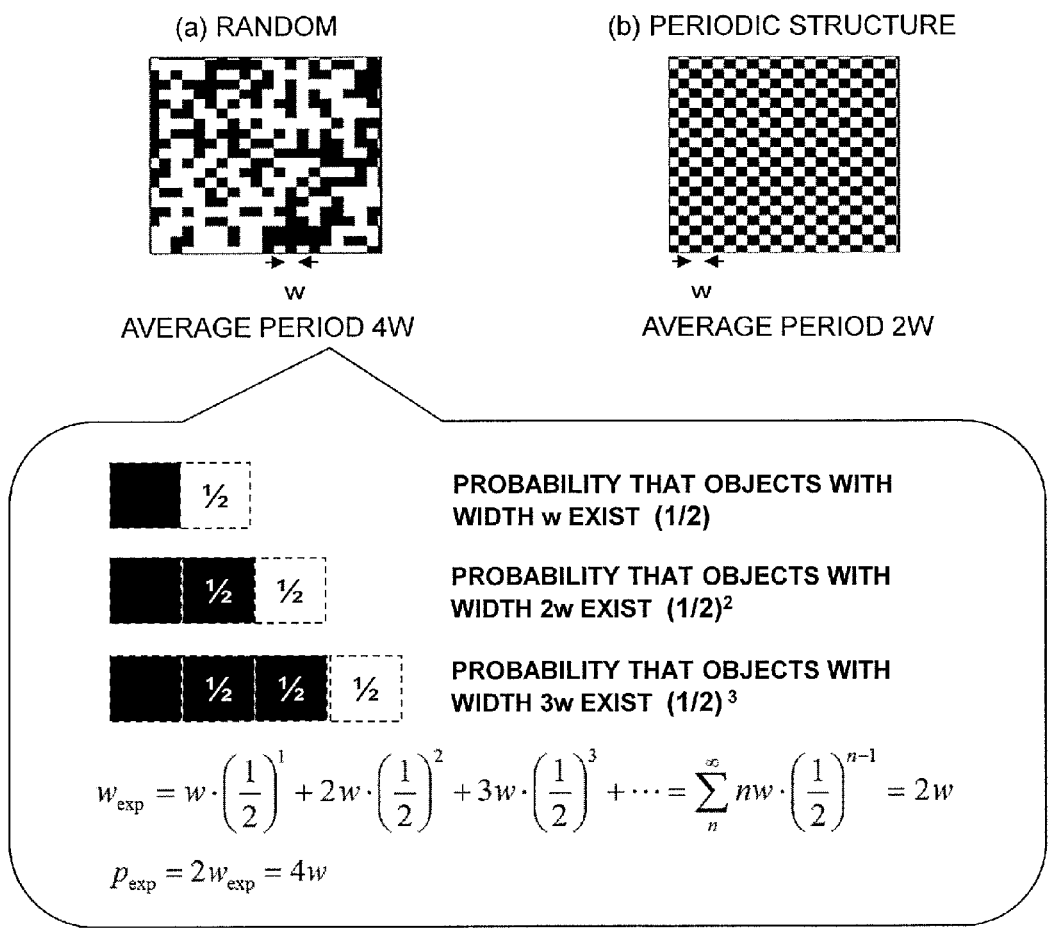
FIG. 22 (a) and (b) are diagrams for explaining the period of a bump-dent structure.

First, with reference to FIG. 22, the principle behind a bump-dent structure will be described. When two kinds of unit structures (blocks) with a width w are randomly arrayed, there will be an average period of 4w along the arrangement direction in which they are arrayed. On the other hand, when blocks with a width w are periodically arrayed, there will be an average period of 2w along the direction in which they are arrayed. Note that an average period $p_{exp}$ when blocks are randomly arrayed can be determined by a calculation which is indicated in a balloon in FIG. 22.

In the present embodiment, a bump-dent structure with controlled randomness can be adopted. A "structure with controlled randomness" means a structure whose randomness is reduced so that no blocks of the same kind successively appear a predetermined number of times or more along one direction, rather than a completely random structure. As has been described with reference to FIG. 4A, by adopting a bump-dent structure with controlled randomness, it becomes possible to further improve the light extraction efficiency.

Figure 23:
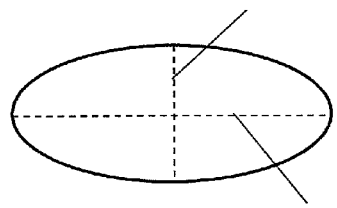
FIG. 23 Another diagram for explaining the period of a bump-dent structure.
Figure 23:
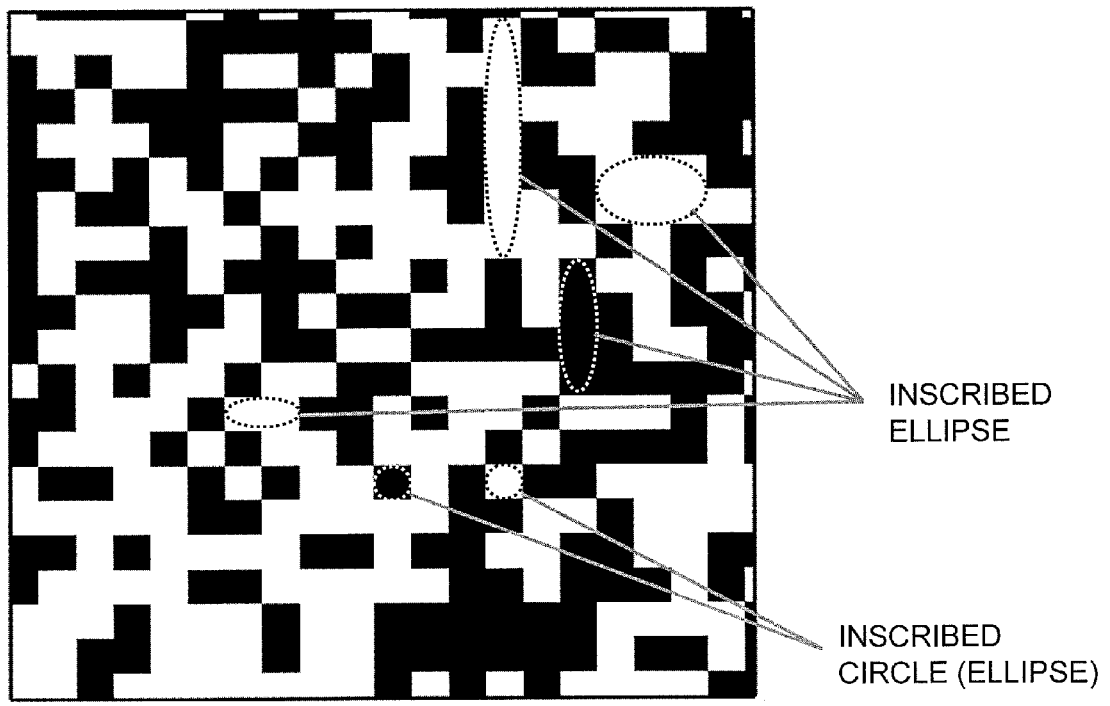

In a structure with controlled randomness, too, an average period can be determined based on a similar principle to the above. A method of determining an average period from the pattern of a structure is shown in FIG. 23. Ellipses will now be considered, each being inscribed in a region consisting of successive unit structures of the same kind, with respect to both of the lateral direction and the vertical direction in FIG. 23. In the lower diagram of FIG. 23, an average value of the sizes of the white portions can be determined by calculating an average value of the axial lengths of ellipses which are inscribed in the white portions. Herein, an "axial length" refers to the length a of the minor axis or the length b of the major axis as illustrated in the upper diagram of FIG. 23. The same also applies to the black portions. An average period is defined by a value obtained by taking a sum of these average values.

Figure 24:
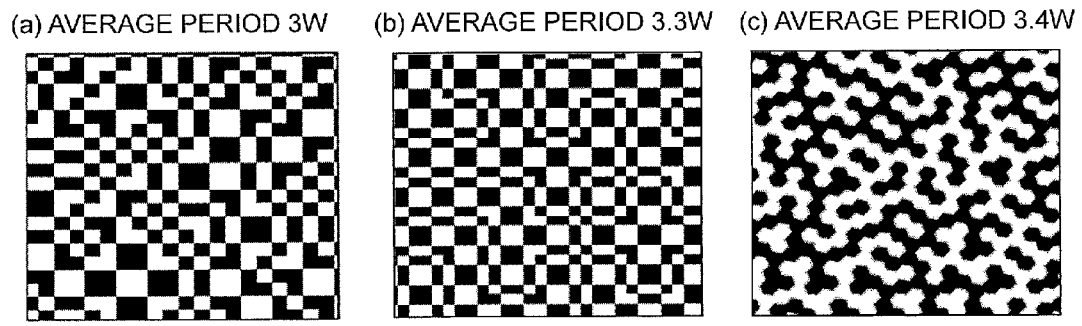
FIG. 24 (a) is a diagram showing a first example of a bump-dent structure; (b) is a diagram showing a second example of a bump-dent structure; and (c) is diagram showing a third example of a bump-dent structure.

FIGS. 24 (a) to (c) are diagrams showing examples of bump-dent structures with controlled randomness (with average periods of 3w, 3.3w and 3.4w, respectively). As shown in FIG. 24(c), a bump-dent structure may be a structure including an array of blocks of shapes other than squares, e.g., hexagons.

Figure 25:
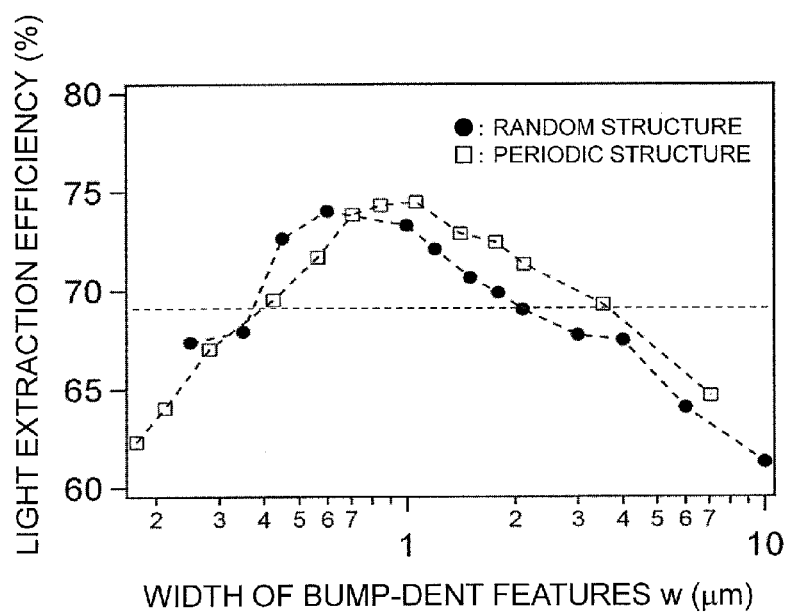
FIG. 25 A graph showing dependence of light extraction efficiency on the width of bump-dent features.

FIG. 25 is a graph showing results of calculating dependence of light extraction efficiency on the width w of the bump-dent features. Herein, the height h of the structure is 1.0 μm. The transparent substrate 14 has a refractive index of 1.5; the low-refractive index layer 15a has a refractive index of 1.35; and the high-refractive index layer 15b has a refractive index of 2.0. In the figure, (●) indicates results when adopting bump-dent features composed of randomly-arrayed blocks as shown in FIG. 22(a), and (□) indicates results when adopting bump-dent features composed of periodically-arrayed blocks as shown in FIG. 22(b). In the case of adopting a random structure, a light extraction efficiency of about 70% or more can be obtained so long as w is in the range from 0.4 to 2 μm. In the case of adopting a periodic structure, a light extraction efficiency of about 70% or more can be obtained so long as w is in the range from 0.4 to 4 μm.

Light is not diffracted by any structure that is sufficiently smaller than its wavelength. Therefore, regardless of a random structure or a periodic structure, it will not be effective to array unit structures that are 400 nm or less. Given an average wavelength λ of light occurring from the emission layer 12, w may be set to 0.73λ (=λ×400/550) or more, for example. On the other hand, it has been found that, in any region with unit structures that are sufficiently larger than the wavelength, a light extraction efficiency of about 70% or more can be obtained by setting w to 2 μm or less for a random structure, or setting w to 4 μm or less for a periodic structure. Since a random structure has an average period of 4w and a periodic structure has an average period of 2w, it will be understood that the light extraction efficiency is governed by the average period, irrespective of the pattern of the structure. The average period, p, may be set to 8 μm or less, for example. Moreover, from the principle of light diffraction, a diffraction pattern of light is determined by a ratio between the structure size (period) and the light wavelength (i.e., p/λ); therefore, the average period p may be set to 14.5(=8/0.55)λ or less, for example.

There is not much difference in light extraction efficiency between a random structure and a periodic structure. However, it is considered that a periodic structure will have large wavelength dependence due to the nature of a diffraction grating, thus resulting in a large color unevenness with respect to the viewing angle. Therefore, in order to reduce color unevenness with respect to the viewing angle, features composed of randomly arrayed structures may be adopted as the bump-dent features.

Figure 26:
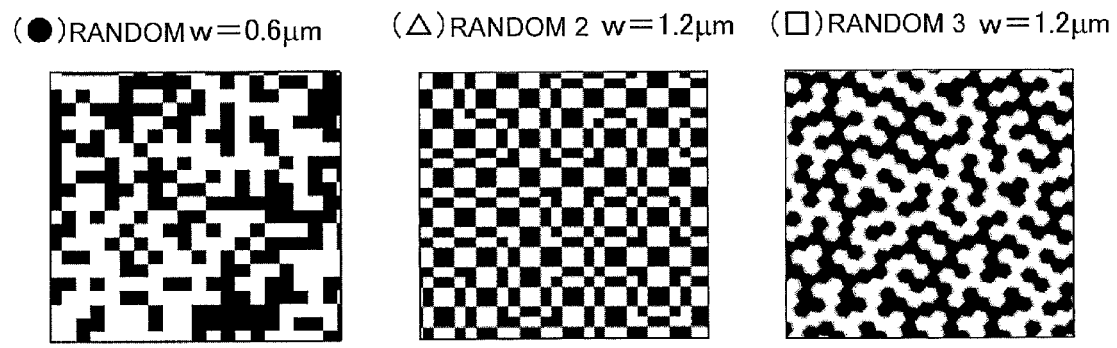
FIG. 26 A diagram showing exemplary bump-dent structures with controlled randomness.
Figure 27:
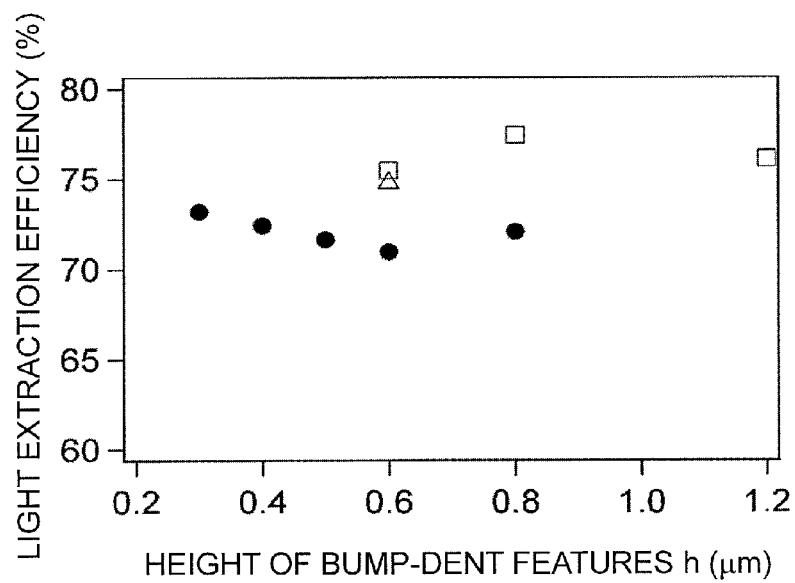
FIG. 27 A graph showing dependence of light extraction efficiency on the height h of a bump-dent structure, and dependence of light extraction efficiency on the degree of randomness.

Next, with reference to FIG. 26 and FIG. 27, dependence of light extraction efficiency on the height h of the bump-dent structure and dependence of light extraction efficiency on the degree of randomness will be described. Samples of organic EL devices having three kinds of bump-dent structures as shown in FIG. 26 were prototyped, and their respective light extraction efficiencies were measured. FIG. is a graph showing results thereof. In FIG. 27, (●)(Δ)(□) represent results of calculations performed for the corresponding random structures in FIG. 26. Herein, the transparent substrate 14 had a refractive index of 1.51; the low-refractive index layer 15a had a refractive index of 1.45; and the high-refractive index layer 15b had a refractive index of 1.76.

In the (●) structure, rectangular solids with a structure size of 0.6 μm and a height of 0.2 to 0.8 μm are randomly arrayed. In the (Δ) structure, rectangular solids with a structure size of 1.2 μm and a height of 0.6 μm are randomly arrayed. However, their randomness is controlled so that no three or more blocks successively appear along the same direction. In the (□) structure, hexagonal columns with a structure size (diameter of a circle inscribed in a hexagon) 1.2 μm and a height of 0.6 to 1.2 μm are randomly arrayed. However, their randomness is controlled so that no four or more blocks successively appear along the same direction. First, as for height dependence, it can be seen that efficiency is hardly affected in any of these structures. Next, as for randomness of the structure, it is indicated that efficiency improves in the order from (●) to (Δ) to (□). A comparison between (●) and (Δ) indicates that it makes for an improved efficiency to control randomness so that successive arrangement of blocks is restricted. This is because, if blocks were side by side in succession, effectively a region of a large structure size would exist, such a region having a deteriorated extraction efficiency. In fact, the (●) random structure manifests places where six or more blocks are side by side in succession along the same direction. In other words, there are local structures that are sized 3.6 μm (=0.6 μm×6) or larger. With reference to the results of dependence of efficiency on the structure size w of the periodic structure shown in FIG. 25, it can be seen that not a very high extraction efficiency is obtained for a structure size of 3.6 μm. This would indicate that regions of such large size would lower the extraction efficiency.

Furthermore, the efficiency is more enhanced when hexagons are arrayed than when rectangles are arrayed. This is because the diagonal length of a square is $\sqrt{2}$ times its side length, whereas the diagonal length of a regular hexagon is $\sqrt{3}/2$ times its side length; thus, regular hexagons have less dependence on orientation. In other words, when squares are arrayed, the extraction efficiency will inevitably be lower along either the side directions or the diagonal directions; on the other hand, in the case of regular hexagons, a high extraction efficiency will be obtained regardless of orientation. Comparison of the experimental results of (Δ) and (□) shown in FIG. 27 also supports this.

Figure 28:
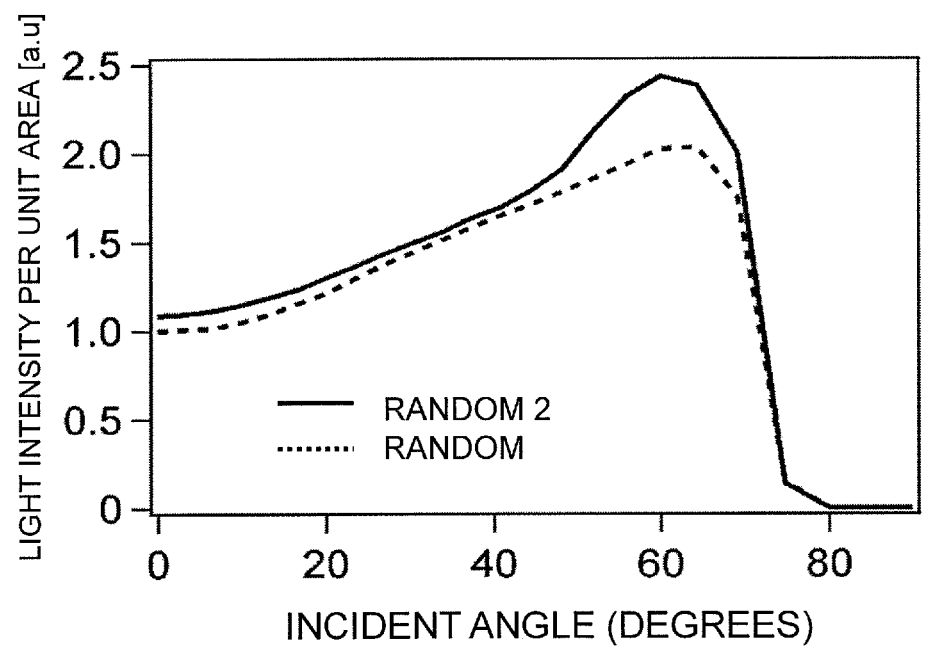
FIG. 28 A graph showing a difference between a completely random pattern and a random pattern with controlled randomness.

In order to examine the effects of patterns with controlled randomness, the distribution of light intensity within the transparent substrate 14 was measured for Random and Random 2 devices (height: 0.6 μm) shown in FIG. 26, with a similar construction to that of FIG. 3. The results are shown in FIG. 28. These results indicate that light on the higher angle side (near 50 to 70 degrees) is particularly increased in the structure with controlled randomness. Thus, a higher efficiency is obtained by combining the internal light-extraction layer 15 having a bump-dent structure of such controlled randomness with the external light-extraction layer 16 having a high transmittance at an incident angle of 60 degrees to 80 degrees.

Figure 29:
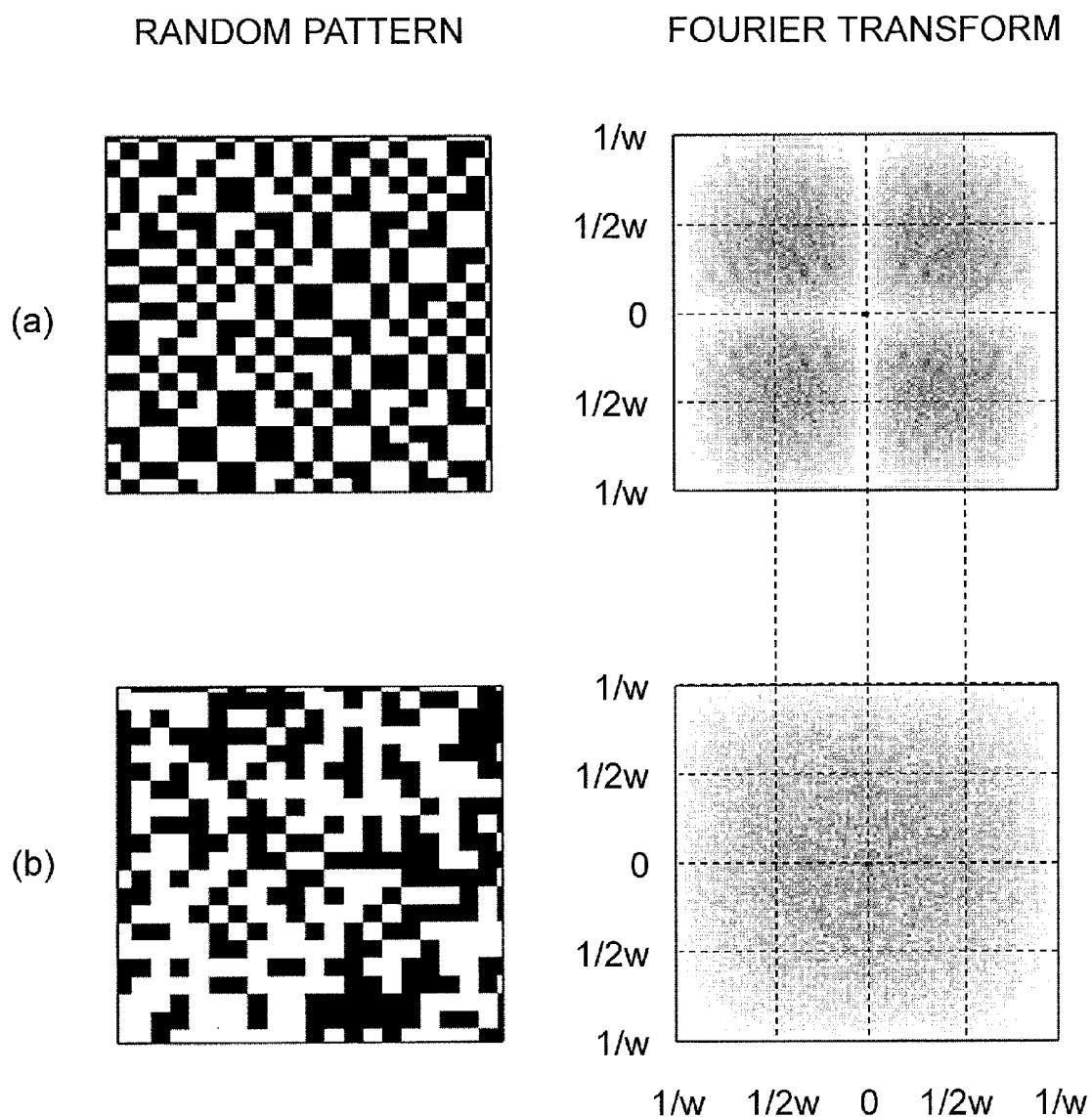
FIG. 29 (a) is a diagram showing Fourier components of a completely random pattern; (b) is a diagram showing Fourier components of a pattern with controlled randomness.

Thus, a method of randomness control based on reducing large blocks emerging from side-by-side successions, as well as effects thereof, was discussed. Reduction in such large blocks can also be checked by applying a Fourier transform to a random pattern. FIG. 29 is a diagram showing amplitude of spatial frequency components when applying a Fourier transform to a random pattern. The center of a distribution diagram on the right-hand side of FIG. 29 shows a component whose spatial frequency is zero (DC component). This diagram is illustrated so that spatial frequency increases from the center toward the outside. As will be understood from the figure, low-frequency components are suppressed in the spatial frequencies of the controlled random pattern shown in FIG. 29(a), as compared to the random pattern shown in FIG. 29(b). In particular, among the spatial frequency components, those components which are smaller than 1/(2w) are suppressed.

In the present embodiment, a bump-dent structure is created by arraying blocks of the same size; with a random array of these, the light extraction efficiency becomes as high as over about 70% when w is set to a value in a range from 0.4 to 2 μm, as shown in FIG. 25. Based on this, it would also be applicable to randomly array a plurality of blocks whose size is appropriately altered within this range.

Figure 30:
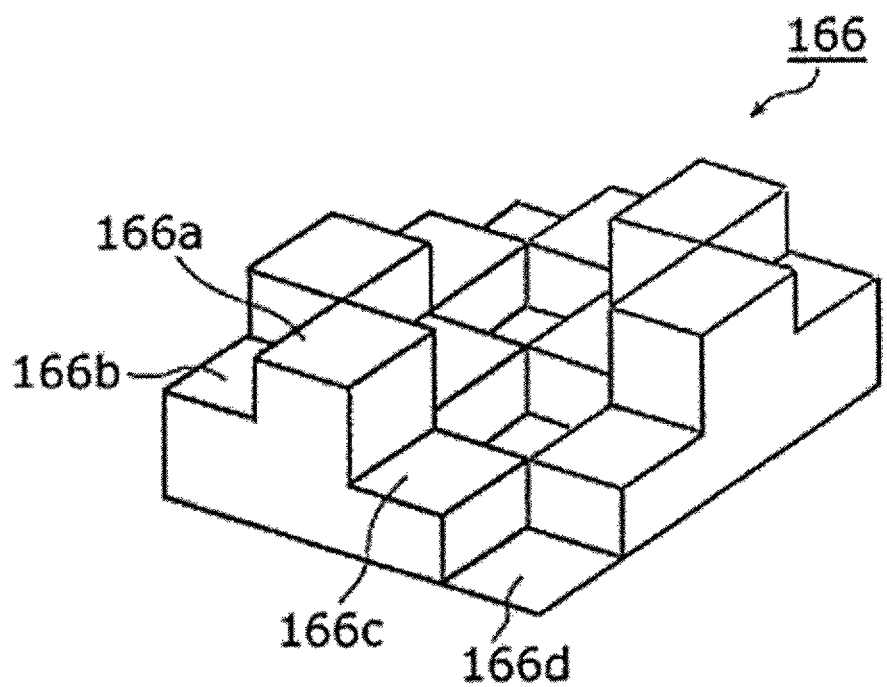
FIG. 30 A diagram showing a variant bump-dent structure.

Moreover, phase differences are imparted to light according to the height of each block, thus to diffract light for light extraction. Therefore, the height h of the blocks does not need to be constant. For example, a plurality of height levels may be introduced. Moreover, there may be random heights among blocks. FIG. 30 is a perspective view showing an exemplary construction in which random block heights are adopted. The bump-dent structure 166 shown in the figure includes a random two-dimensional array of first unit structures 166a of a first height, second unit structures 166b of a second height, third unit structures 166c of a third height, and fourth unit structures 166d of a fourth height. In the bump-dent structure 166, each block is filled with a high-refractive index material and a low-refractive index material, so that differences occur in the phase of light which travels through these portions. Therefore, even in the case of random heights, an average phase difference of transmitted light is to be determined by an average height of the plurality of unit structures, such that a sufficient average phase difference will be imparted to the transmitted light also in this case. Thus, random heights may be adopted.

The corner portion(s) of each cross-sectional shape may rounded. In fact, when structures on the micron order are processed through cutting, a semiconductor process, etc., there are cases where the corner portions are processed so as to be rounded, or stepped portions are processed into slopes.

If these factors arise when processing the bump-dent structure of the internal light-extraction layer 15, any structure with corner portions being processed so as to be rounded is also encompassed within the present construction, so long as the aforementioned properties of a random pattern are not lost.

Even in the presence of noises such as small structures sized 0.73λ or less that may unintentionally occur during manufacture (originating from litter or the like) or large structures of 4 μm or more (scratches or the like), sufficient effects will still be obtained so long as they are on the order of 10% of the overall area. Therefore, even if such noises are intentionally introduced on the order of 10%, such will be encompassed by the present invention so long as the effects are obtained.

Although the light-emitting element 110 in the above embodiment emits light through organic EL, it is also possible to use other light-emitting elements, e.g., inorganic EL. In other words, the light-emitting element 110 may have any arbitrary construction so long as a light extraction sheet 120 including the internal light-extraction layer 15, the transparent substrate 14, and the external light-extraction layer 16 is provided. Instead of the reflection electrode 11 in the above description, an electrode which lacks a light-reflecting property may be used.

INDUSTRIAL APPLICABILITY

An illuminator according to the present disclosure is applicable to flat panel displays, backlights for liquid crystal display devices, light sources for illumination, etc., for example. A light extraction sheet according to the present disclosure is applicable to the aforementioned illuminator.

REFERENCE SIGNS LIST 11 reflection electrode
12 emission layer
13 transparent electrode
14 transparent substrate
15 internal light-extraction layer 15a low-refractive index layer
15b high-refractive index layer
16 external light-extraction layer
100 organic EL device
110 light-emitting element
120 light extraction sheet

The invention claimed is:

1. An illuminator comprising:
a light-emitting element for emitting light of an average wavelength λ; and
a light extraction sheet which transmits light emitted from the light-emitting element,
the light-emitting element including
a first electrode having a light transmitting property,
a second electrode, and
an emission layer between the first and second electrodes, and
the light extraction sheet including:
a light-transmitting substrate having a first face on the light-emitting element side and a second face on an opposite side from the light-emitting element;
a first light extraction structure on the first face side of the light-transmitting substrate, the first light extraction structure including a low-refractive index layer and a high-refractive index layer having a higher refractive index than a refractive index of the low-refractive index layer, the low-refractive index layer being between the light-transmitting substrate and the high-refractive index layer, and an interface between the high-refractive index layer and the low-refractive index layer having bump-dent features; and
a second light extraction structure on the second face side of the light-transmitting substrate, the second light extraction structure being arranged so that light which is transmitted through the light-transmitting substrate and arrives at an incident angle of 60 degrees to 80 degrees has an average transmittance of 20% or more.

2. The illuminator of claim 1, wherein the second light extraction structure comprises a diffusing layer including a light-transmitting member having a refractive index $n_a$ and a plurality of diffusive particles inside the light-transmitting member, the plurality of diffusive particles having a refractive index $n_b$.

3. The illuminator of claim 2, wherein, given a rate p which the volume of the plurality of diffusive particles accounts for in the volume of the diffusing layer, a thickness d of the diffusing layer, and an average radius r of the plurality of diffusive particles, a diffusing power D which is defined as:

$$D = \frac{|n_a - n_b|}{n_a} \cdot p \cdot \frac{d}{r}$$

is greater than 0 and not more than 5.

4. The illuminator of claim 1, wherein the second light extraction structure has geometric features on a surface through which light is emitted.

5. The illuminator of claim 4, wherein an array of trapezoidal prisms is provided on the surface of the second light extraction structure through which light is emitted.

6. The illuminator of claim 5, wherein,
the trapezoidal prisms each have a cross-sectional shape which is a trapezoid resulting from a triangle having a truncated vertex, and an aspect ratio is defined as a ration of the height 1 of the trapezoid to the height L of the triangle, such that:
a vertex angle of each triangle is not less than 10 degrees and not more than 18 degrees, and the aspect ratio is not less than 0.73 but less than 1; or
a vertex angle of each triangle is not less than 45 degrees and not more than 115 degrees, and the aspect ratio is not less than 0.44 but less than 1.

7. The illuminator of claim 4, wherein a microlens array is provided on the surface of the second light extraction structure through which light is emitted.

8. The illuminator of claim 7, wherein an aspect ratio defined as a ratio between the height and the radius of the microlens array is greater than 0.5.

9. The illuminator of claim 4, wherein an array of pyramid shapes is provided on the surface of the second light extraction structure through which light is emitted.

10. The illuminator of claim 9, wherein the pyramid shapes each have a vertex angle of not less than 25 degrees and not more than 115 degrees.

11. The illuminator of claim 4, wherein a portion of the second light extraction structure that has the geometric features has a packing fraction of 36% or more.

12. The illuminator of claim 1, wherein the low-refractive index layer has a thickness of (½)λ or more.

13. The illuminator of claim 1, wherein the bump-dent features comprise a random or periodic two-dimensional array of a plurality of dents and a plurality of bumps.

14. The illuminator of claim 1, wherein the bump-dent features comprise a two-dimensional array of a plurality of dents and a plurality of bumps, and among spatial frequency components of a pattern of the bump-dent features, those components which are smaller than 1/(2w) are suppressed as compared to when the plurality of dents and the plurality of bumps are randomly arrayed, where w is a minimum value of lengths of shorter sides of ellipses which are inscribed in the plurality of dents and the plurality of bumps.

15. The illuminator of claim 14, wherein the bump-dent features are arranged so that no three or more dents or bumps are successively present along one direction.

16. The illuminator of claim 14, wherein the plurality of dents and the plurality of bumps both have an average period of 14.5λ or less.

17. The illuminator of claim 13, wherein a minimum value of lengths of shorter sides of ellipses which are inscribed in the plurality of dents and the plurality of bumps is 0.73λ or more.

18. The illuminator of claim 13, wherein the plurality of dents and the plurality of bumps each have a rectangular or hexagonal cross section.

19. A light extraction sheet comprising:
a light-transmitting substrate having a first face and a second face;
a first light extraction structure on the first face side of the light-transmitting substrate, the first light extraction structure including a low-refractive index layer and a high-refractive index layer having a higher refractive index than a refractive index of the low-refractive index layer, the low-refractive index layer being between the light-transmitting substrate and the high-refractive index layer, and an interface between the high-refractive index layer and the low-refractive index layer having bump-dent features; and
a second light extraction structure on the second face side of the light-transmitting substrate, the second light extraction structure being arranged so that light which is transmitted through the light-transmitting substrate and arrives at an incident angle of 60 degrees to 80 degrees has an average transmittance of 20% or more.

* * * * *